(12) United States Patent
Ogiwara et al.

(10) Patent No.: US 7,411,809 B2
(45) Date of Patent: Aug. 12, 2008

(54) FERROELECTRIC MEMORY TO BE TESTED BY APPLYING DISTURBANCE VOLTAGE TO A PLURALITY OF FERROELECTRIC CAPACITORS AT ONCE IN DIRECTION TO WEAKEN POLARIZATION, AND METHOD OF TESTING THE SAME

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 11/417,154

(22) Filed: May 4, 2006

(65) Prior Publication Data

US 2007/0109834 A1    May 17, 2007

(30) Foreign Application Priority Data

Nov. 17, 2005    (JP)    ............................. 2005-332957

(51) Int. Cl.
*G11C 11/22*    (2006.01)
*G11C 5/06*    (2006.01)
*G11C 7/00*    (2006.01)
*G11C 29/00*    (2006.01)

(52) U.S. Cl. ......................... 365/145; 365/65; 365/191; 365/201

(58) Field of Classification Search .................. 365/63, 365/145, 191, 201
See application file for complete search history.

(56) References Cited

U.S. PATENT DOCUMENTS

| | | | |
|---|---|---|---|
| 6,944,046 B2 | 9/2005 | Ogiwara | |
| 6,993,691 B2* | 1/2006 | Ogiwara et al. | 714/721 |
| 7,154,766 B2* | 12/2006 | Oikawa et al. | 365/145 |
| 7,218,546 B2* | 5/2007 | Miyakawa et al. | 365/145 |
| 2002/0188893 A1* | 12/2002 | Ogiwara et al. | 714/42 |
| 2004/0179385 A1* | 9/2004 | Ogiwara | 365/145 |
| 2006/0077703 A1* | 4/2006 | Miyakawa et al. | 365/145 |

FOREIGN PATENT DOCUMENTS

JP    2002-313100    10/2002

OTHER PUBLICATIONS

Joseph M. Benedetto, et al., "Effects of operating conditions on the fast-decay component of the retained polarization in lead zirconate titanate thin films", Journal Appl. Phys., vol. 75 (1), Jan. 1, 1994, pp. 460-466.

* cited by examiner

*Primary Examiner*—Ly D Pham
(74) *Attorney, Agent, or Firm*—Oblon, Spivak, McClelland, Maier & Neustadt, P.C.

(57) ABSTRACT

A unit cell is formed by a ferroelectric capacitor and first MOS transistor, and a block is formed by connecting a plurality of unit cells in series. The gates of the first MOS transistors in the individual unit cells are connected to word lines, which are selectively driven by a word line driver on the basis of a row address signal. A plate line is connected to one terminal of the block, and driven by a plate line driver. A bit line is connected to the other terminal of the block via a second MOS transistor for block selection, and selected by a column decoder on the basis of a column address. A driver/controller controls the plate line driver and column decoder to apply a potential difference between the plate line and bit line, while a plurality of word lines are kept off.

16 Claims, 39 Drawing Sheets

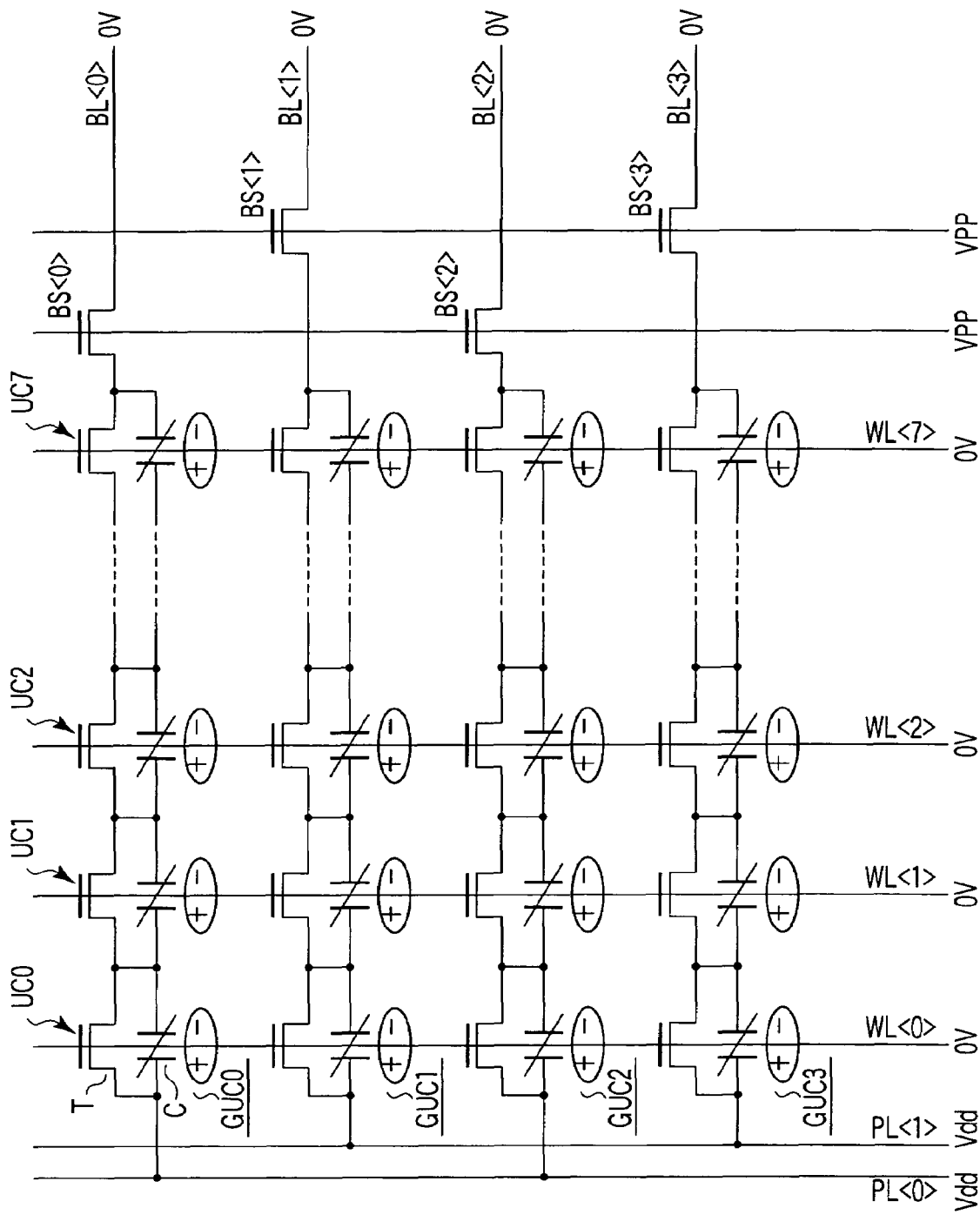
F I G. 2

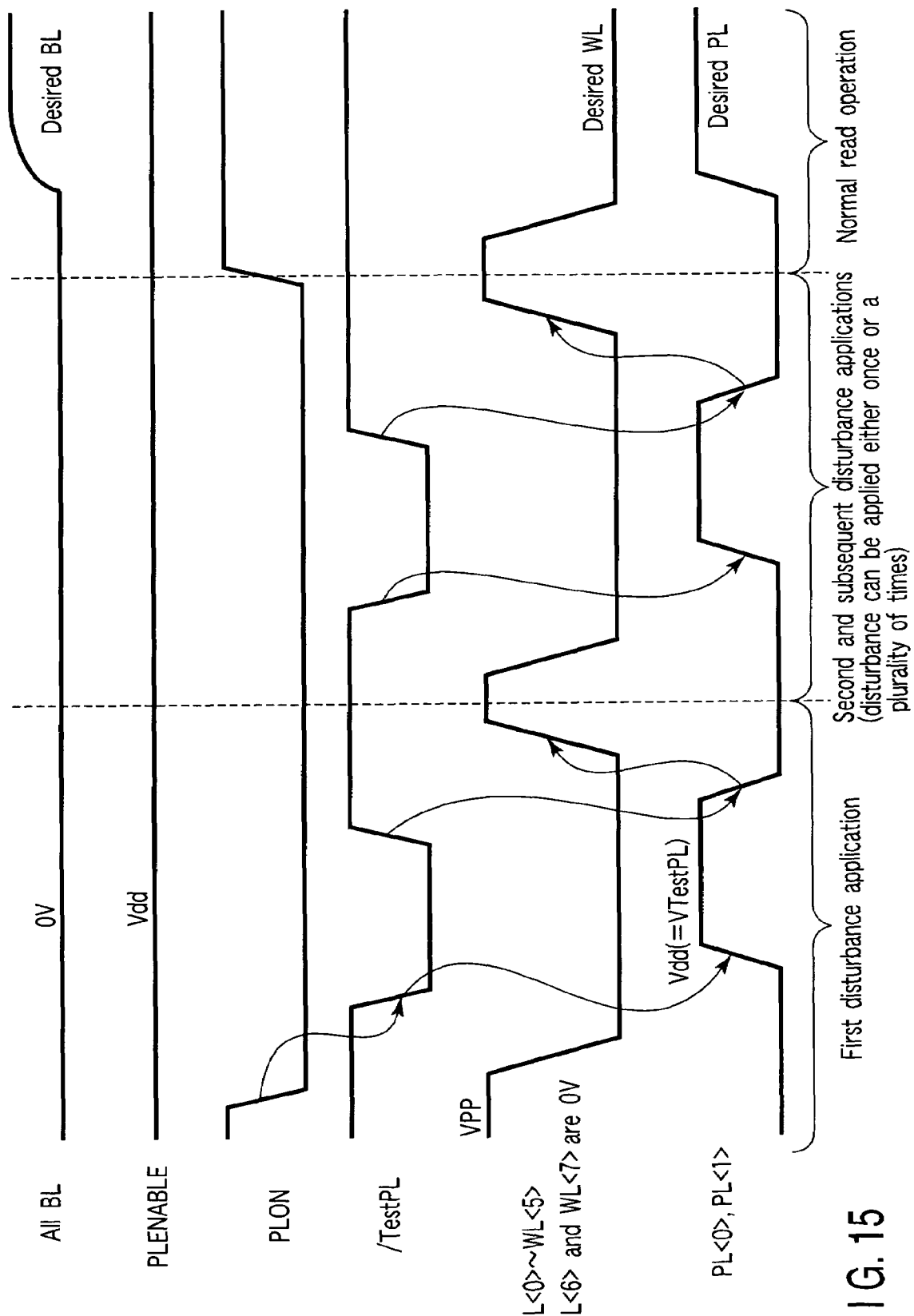
F I G. 15

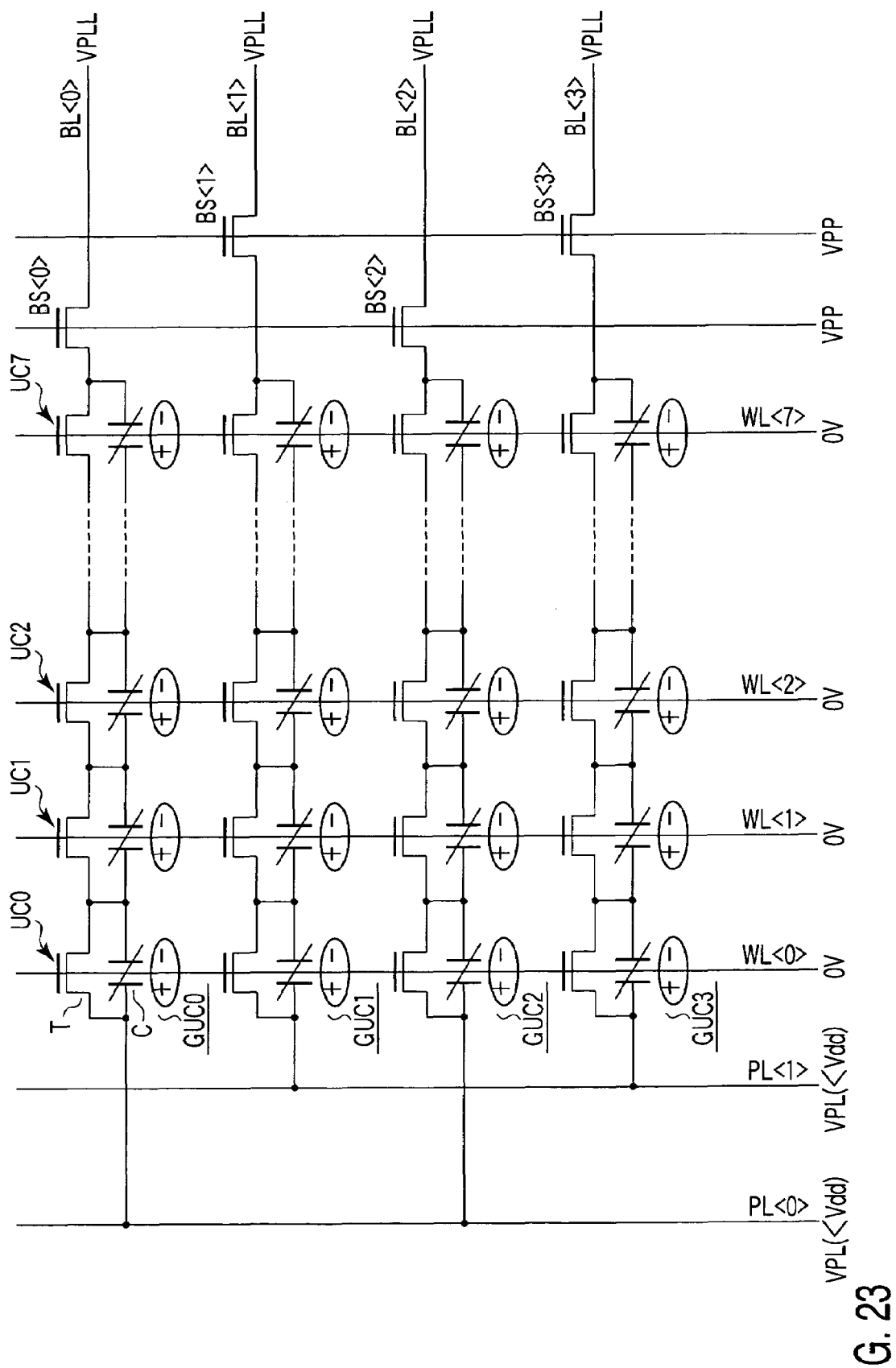
F I G. 23

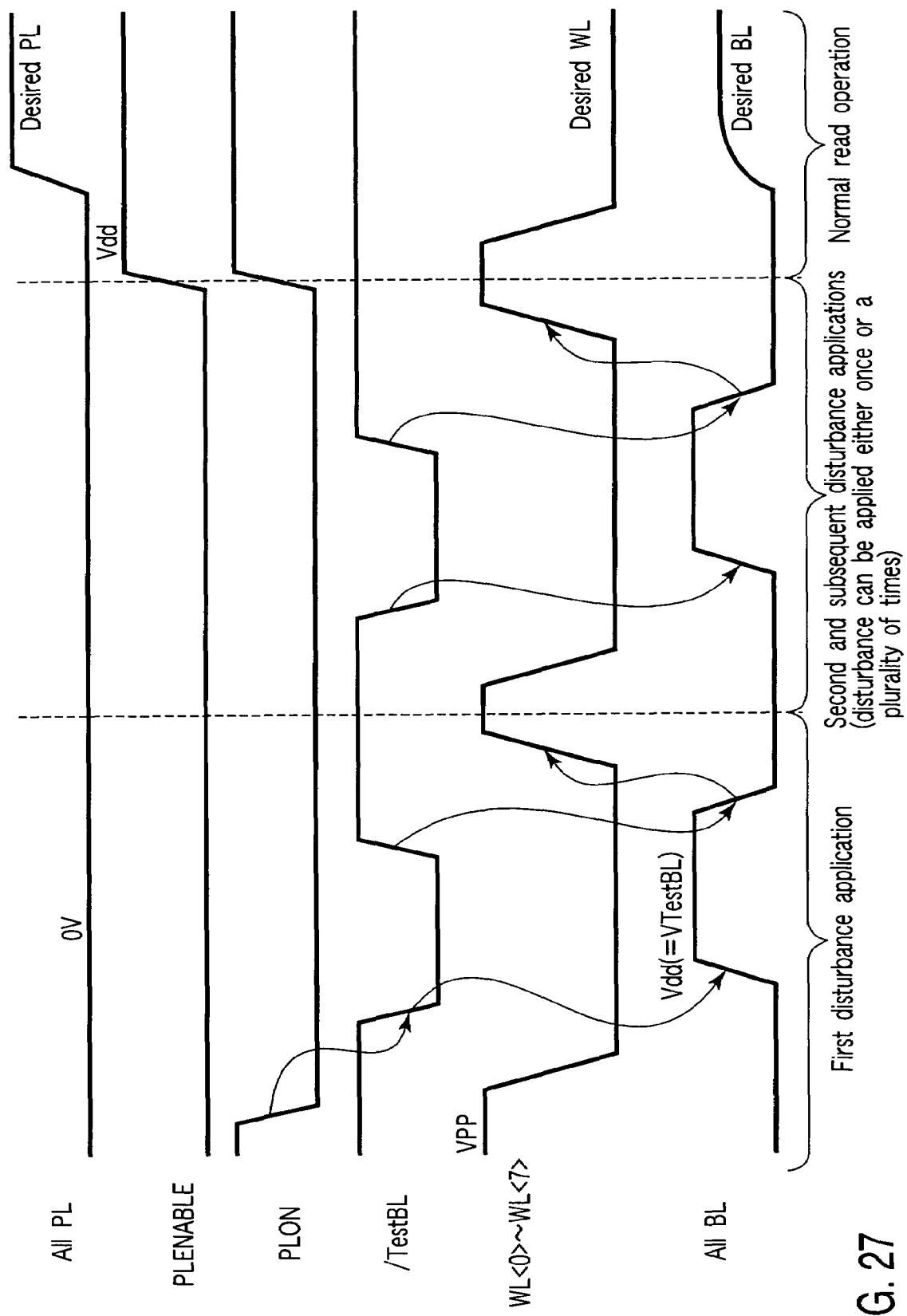
F I G. 27

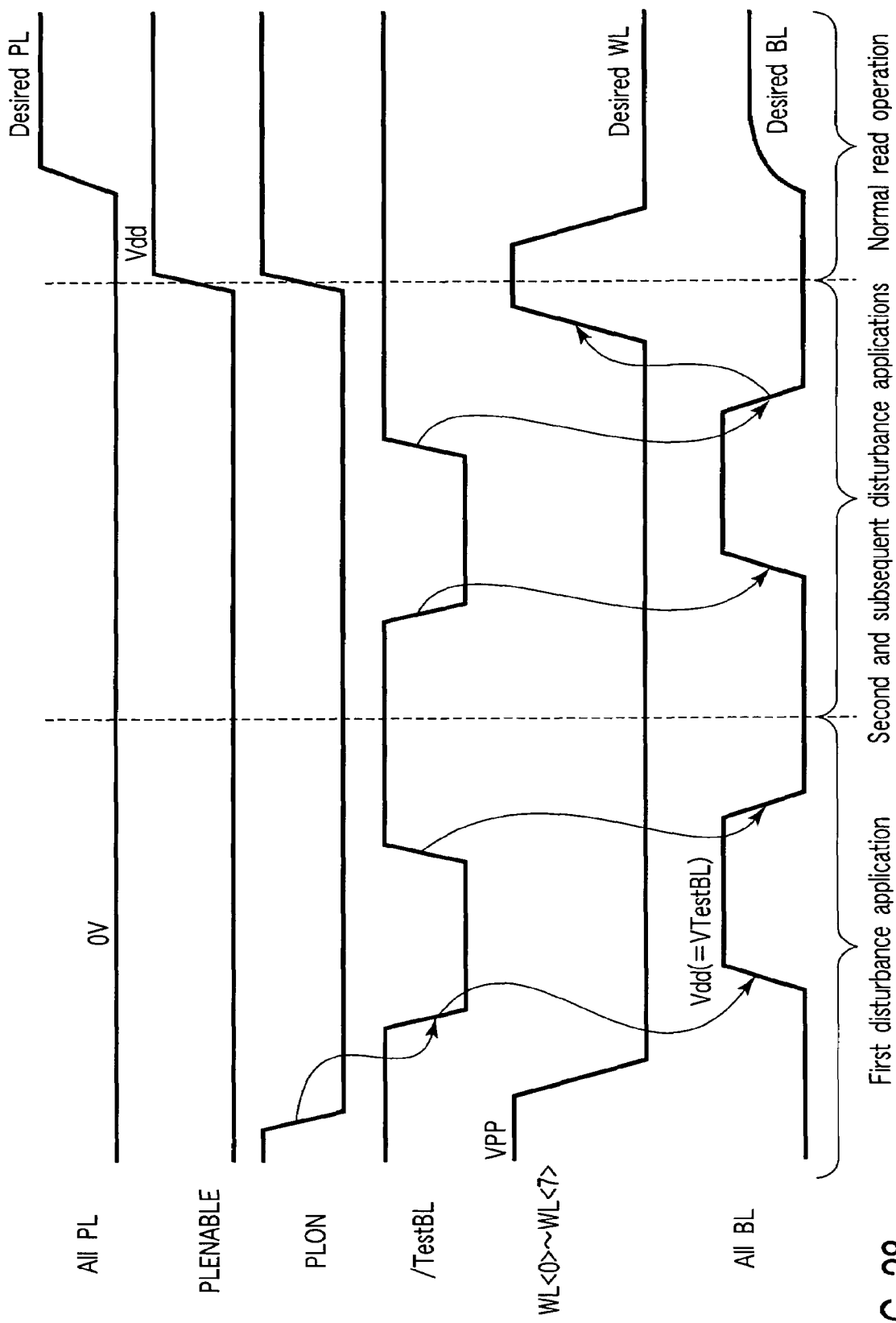
F I G. 28

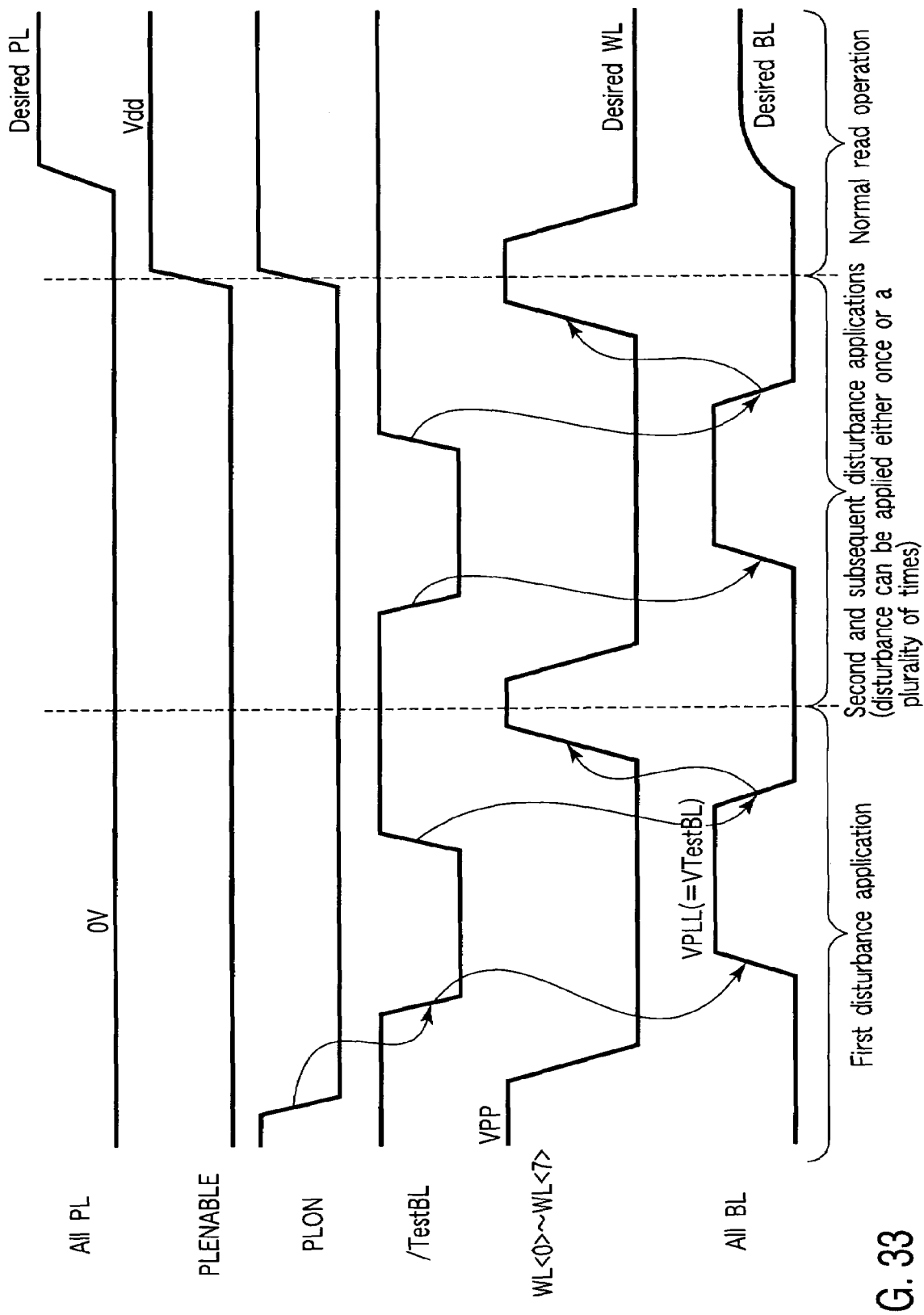
F I G. 33

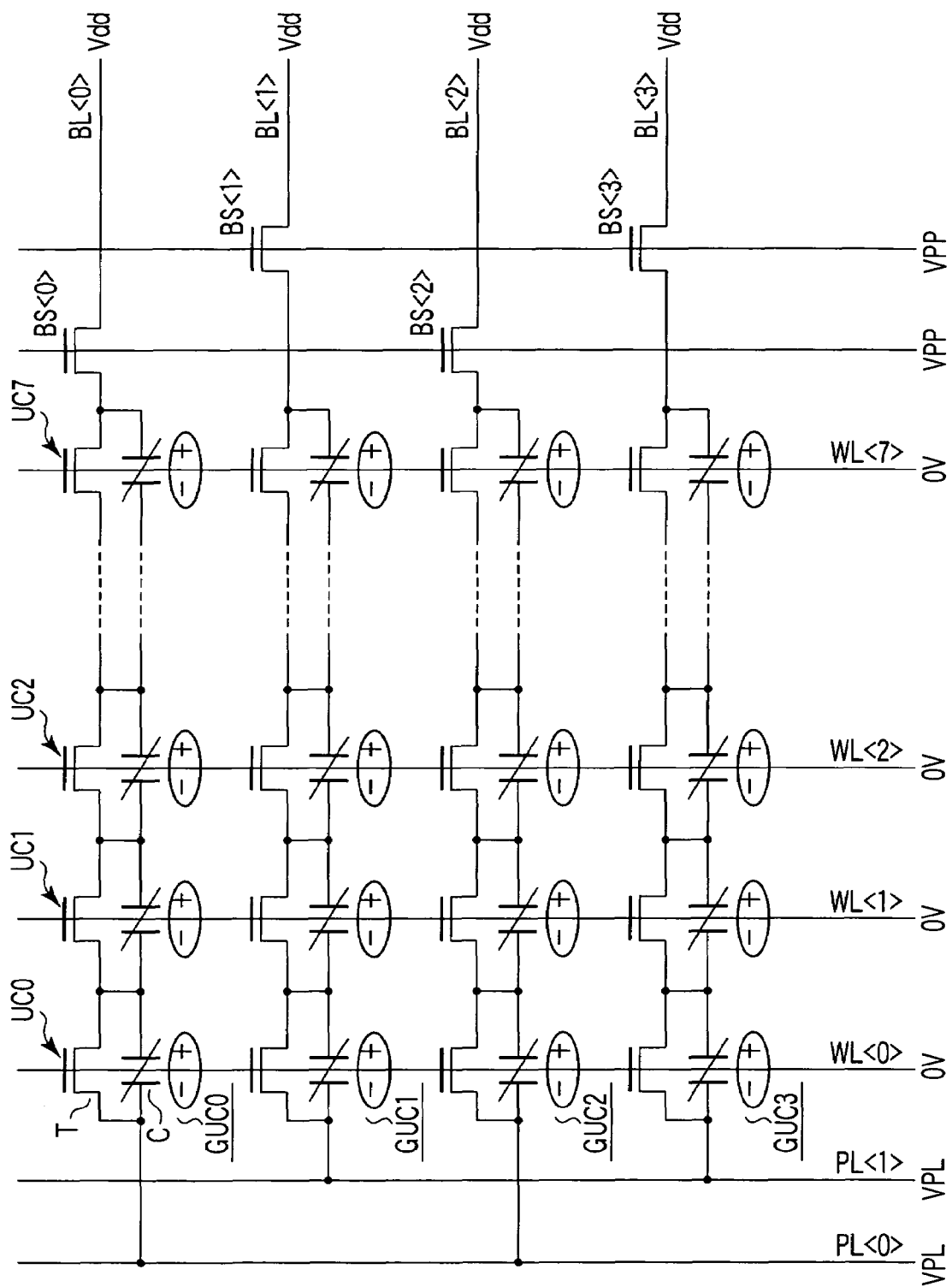
F I G. 35

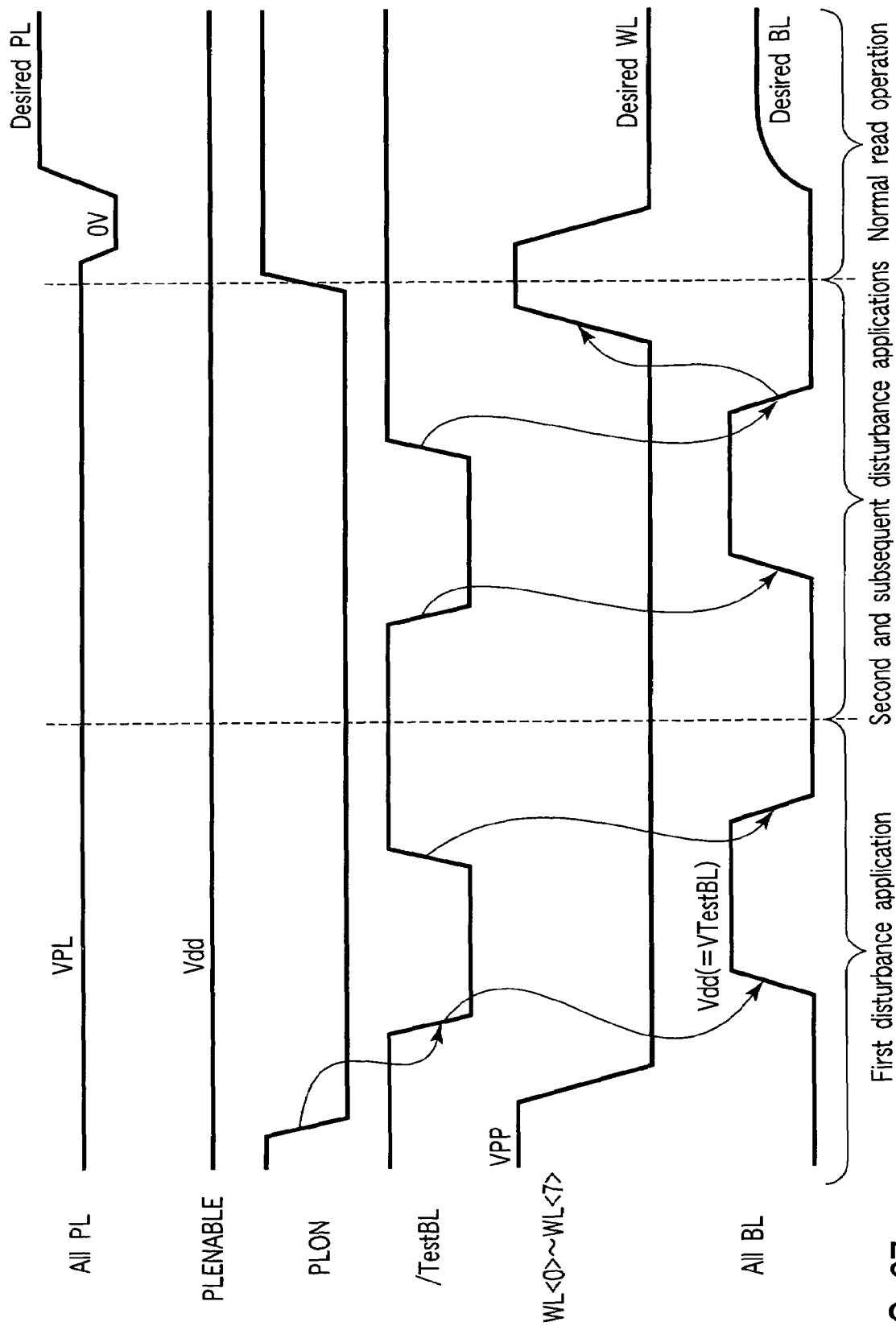
F I G. 37

FERROELECTRIC MEMORY TO BE TESTED BY APPLYING DISTURBANCE VOLTAGE TO A PLURALITY OF FERROELECTRIC CAPACITORS AT ONCE IN DIRECTION TO WEAKEN POLARIZATION, AND METHOD OF TESTING THE SAME

CROSS-REFERENCE TO RELATED APPLICATIONS

This application is based upon and claims the benefit of priority from prior Japanese Patent Application No. 2005-332957, filed Nov. 17, 2005, the entire contents of which are incorporated herein by reference.

BACKGROUND OF THE INVENTION

1. Field of the Invention

The present invention relates to a ferroelectric memory and a method of testing the same and, more particularly, to a ferroelectric memory which is tested by application of a disturbance voltage in order to test, e.g., the hysteresis characteristic of a ferroelectric cell, and a method of testing the same.

2. Description of the Related Art

The conventional tests of the hysteresis characteristics of ferroelectric cells are proposed in, e.g., U.S. Pat. Nos. 5,661,730, 5,991,189, and 5,822,237.

The test methods disclosed in these patent references, however, do not define that after data is written in a ferroelectric cell, data read should wait until depolarization well advances. Therefore, data may be read out immediately after it is written or before depolarization well occurs, so hysteresis characteristics corresponding to actual uses cannot be tested. It is also impossible to screen a ferroelectric cell having a hysteresis curve with a low coercive voltage.

FIG. 1 of J. Appl. Phys. 75(1), 1 Jan. 1994 shows changes in PZT film with time caused by depolarization. According to the measurement results, after data is written in a ferroelectric cell, read should wait for $10^{-3}$ to $10^0$ sec to allow attenuation of the amount of polarization to stop. Accordingly, a test by which data is written and then read out requires a long time if the data is read out after depolarization well advances, and this increases the cost.

The present applicant has proposed a test method capable of reducing the test time in Jpn. Pat. Appln. KOKAI Publication No. 2002-313100. This test sequence is executed following the procedures indicated by steps 1 to 8 below.
(1) Conduct a function test, and calculate the yield
(2) Write initial pattern data
(3) Bake
(4) Calculate the SS yield (same state yield) by reading out the initial pattern data
(5) Write reverse pattern data
(6) Apply a microvoltage equal to or lower than a coercive voltage to a cell capacitor in a direction to weaken polarization
(7) Read out the reverse data pattern, and calculate the OS yield (opposite state yield)
(8) Write the next pattern In the above test sequence, before the test of reading out the reverse data pattern in step 7, step 6 of applying the microvoltage equal to or lower than the coercive voltage in the direction to weaken the polarization of the cell capacitor is executed. A hysteresis curve immediately after the reverse data pattern is written in step 5 has a sufficiently large amount of residual polarization (or remnant polarization). Since step 6 is executed, however, even a large amount of residual polarization which requires a long time to depolarize attenuates, and this is effectively equivalent to performing depolarization within a short time period. Accordingly, a low read potential equivalent to the amount of polarization after depolarization is output to a bit line.

Note that it is experimentally known that this test does not reduce the amount of polarization of a cell which depolarizes within a short time. That is, even when cells requiring long and short time periods to depolarize are mixed, the addition of step 6 makes it possible to read out, from all cells on the surface of a chip, a bit line potential corresponding to the amount of residual polarization after depolarization within a short time period.

Also, a cell having a low coercive voltage fails by polarization reversal when the microvoltage is applied in step 6. Accordingly, a ferroelectric cell having a hysteresis curve with a low coercive voltage can be screened.

As described above, in the test sequence described in Jpn. Pat. Appln. KOKAI Publication No. 2002-313100, the addition of the process in step 6 makes it possible to give the amount of polarization equal to that after a cell capacitor has depolarized within a short time period, and conduct the test in step 7 for polarized data which has effectively depolarized.

In the technique described in Jpn. Pat. Appln. KOKAI Publication No. 2002-313100, however, a disturbance voltage can be applied to only one cell at one time, and it is necessary to form a circuit which generates a microvoltage for disturbance.

Accordingly, there is still room for improvement in respect of the speed and simplicity of the test.

BRIEF SUMMARY OF THE INVENTION

According to an aspect of the present invention, there is provided a ferroelectric memory comprising a block in which a plurality of unit cells each formed by connecting two electrodes of a ferroelectric capacitor to a source and drain of a first MOS transistor are connected in series, word lines each connected to a gate of the first MOS transistor, a word line driver which selectively drives the word lines on the basis of a row address signal, a plate line connected to one terminal of the block, a plate line driver which drives the plate line, a bit line connected to the other terminal of the block via a second MOS transistor for block selection, a column decoder which selects the bit line on the basis of a column address signal, and a driver/controller configured to apply a potential difference between the plate line and the bit line while the plurality of word lines are kept off.

According to another aspect of the present invention, there is provided a method of testing a ferroelectric memory comprising a block in which a plurality of unit cells each formed by connecting two electrodes of a ferroelectric capacitor to a source and drain of a first MOS transistor are connected in series, word lines each connected to a gate of the first MOS transistor, a word line driver which selectively drives the word lines on the basis of a row address signal, a plate line connected to one terminal of the block, a plate line driver which drives the plate line, a bit line connected to the other terminal of the block via a second MOS transistor for block selection, and a column decoder which selects the bit line on the basis of a column address signal, comprising writing data in each unit cell of the block, turning off a plurality of word lines, simultaneously applying a potential difference to a plurality of unit cells in the block between the plate line and the bit line in a direction to weaken polarization of the data written in each unit cell, and reading out the data from each unit cell to evaluate the unit cell.

According to still another aspect of the present invention, there is provided a method of testing a ferroelectric memory comprising a block in which a plurality of unit cells each formed by connecting two electrodes of a ferroelectric capacitor to a source and drain of a first MOS transistor are connected in series, word lines each connected to a gate of the first MOS transistor, a word line driver which selectively drives the word lines on the basis of a row address signal, a plate line connected to one terminal of the block, a plate line driver which drives the plate line, a bit line connected to the other terminal of the block via a second MOS transistor for block selection, and a column decoder which selects the bit line on the basis of a column address signal, comprising writing data in each unit cell of the block, turning off a plurality of word lines, applying first disturbance to each unit cell in the block by applying a plate line driving potential higher than a bit line driving potential, applying second disturbance to each unit cell in the block by applying a bit line driving potential higher than the plate line driving potential, and reading out the data from each unit cell to evaluate the unit cell.

BRIEF DESCRIPTION OF THE SEVERAL VIEWS OF THE DRAWING

FIG. 2 is a circuit diagram showing the arrangement of a memory cell array shown in FIG. 1 by taking a TC parallel unit series-connected type ferroelectric memory as an example;

FIG. 15 is a timing chart for explaining the operation of the circuit shown in FIG. 14;

FIG. 23 is a circuit diagram for explaining a ferroelectric memory and a method of testing the same according to the 13th embodiment of the present invention, in which the arrangement of a memory cell array and the applied voltages are illustrated by taking a TC parallel unit series-connected type ferroelectric memory as an example;

FIG. 27 is a timing chart for explaining the operation of the circuit shown in FIG. 26;

FIG. 28 is a timing chart for explaining a ferroelectric memory and the operation of a method of testing the same according to the 16th embodiment of the present invention;

FIG. 33 is a timing chart for explaining the operation of the circuit shown in FIG. 32;

FIG. 35 is a circuit diagram for explaining a ferroelectric memory and a method of testing the same according to the 21st embodiment of the present invention, in which the arrangement of a memory cell array and the applied voltages are illustrated by taking a TC parallel unit series-connected type ferroelectric memory as an example;

FIG. 37 is a timing chart for explaining a ferroelectric memory and the operation of a method of testing the same according to the 22nd embodiment of the present invention;

DETAILED DESCRIPTION OF THE INVENTION

First Embodiment

Figure 1:
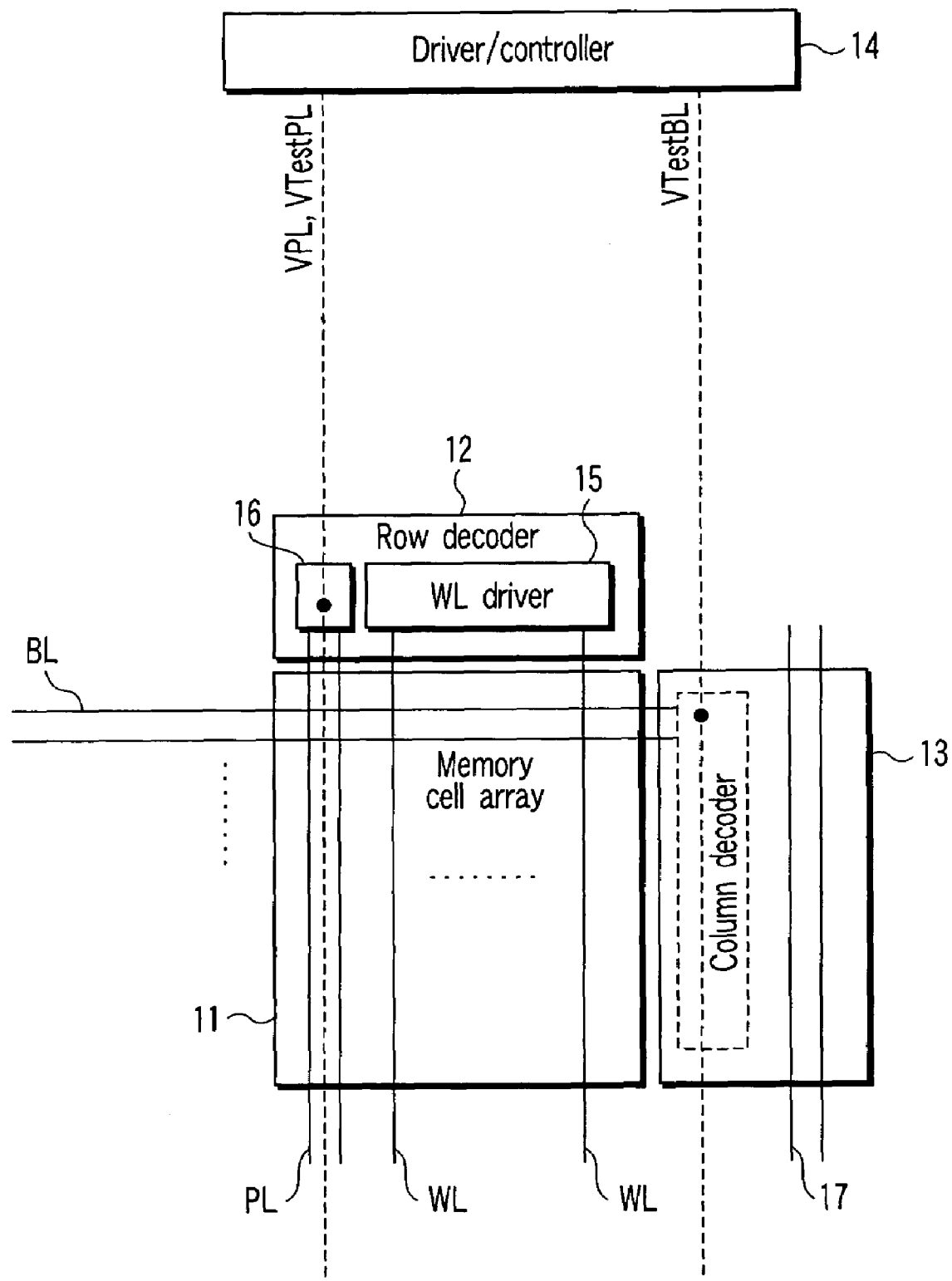
FIG. 1 is a block diagram for explaining a ferroelectric memory and a method of testing the same according to the first embodiment of the present invention, in which main components related to the test are schematically illustrated.
Figure 3:
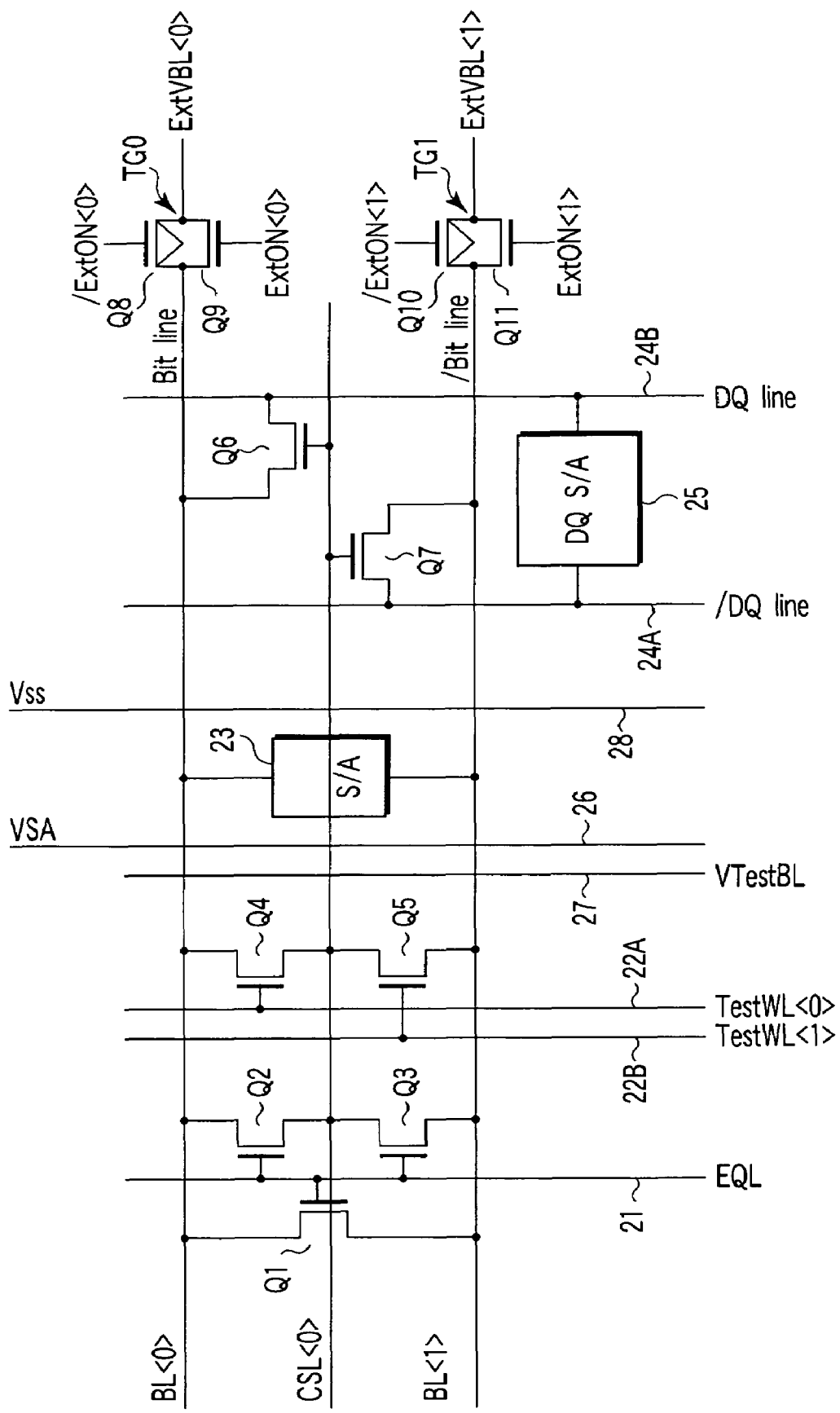
FIG. 3 is a circuit diagram showing the arrangement of a sense amplifier and its periphery.
Figure 4:
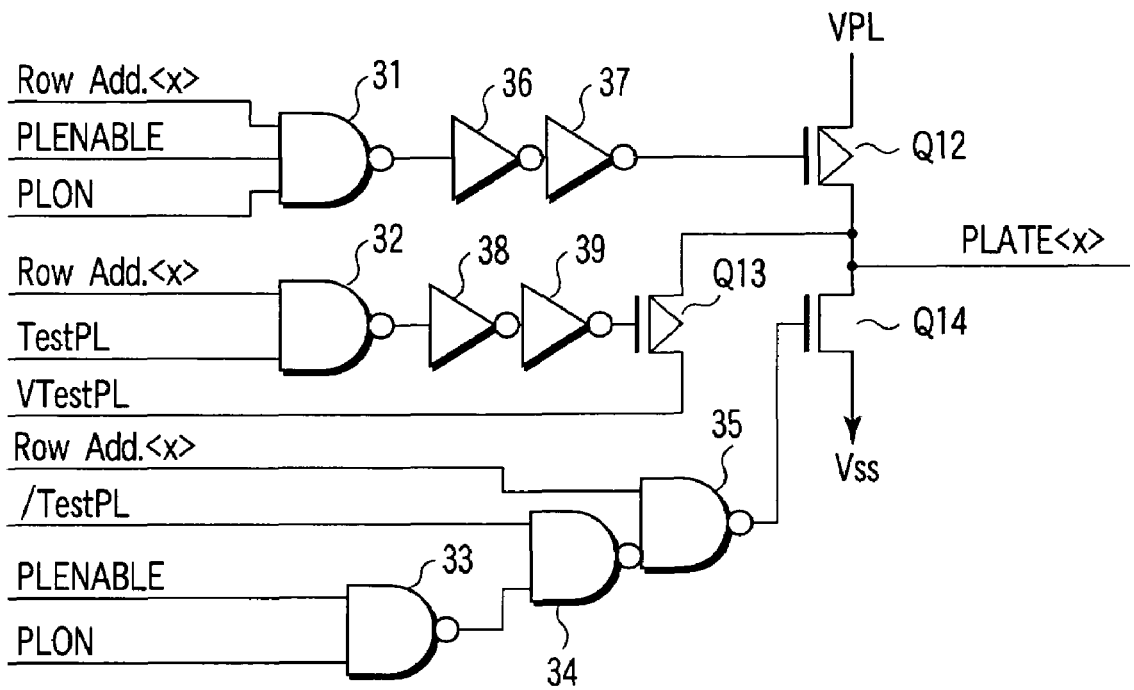
FIG. 4 is a circuit diagram showing the arrangement of a part of a driver/controller in the circuit shown in FIG. 1, in which a circuit for supplying a potential to a plate line and a controller of the circuit are illustrated.
Figure 5:
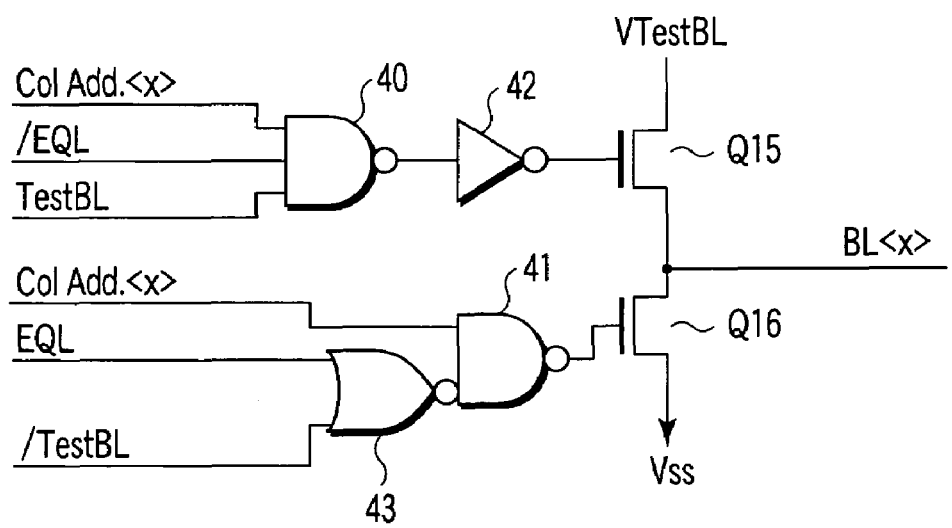
FIG. 5 is a circuit diagram showing the arrangement of a part of a driver/controller in the circuit shown in FIG. 1, in which a circuit for supplying a potential to a bit line and a controller of the circuit are illustrated.
Figure 6:
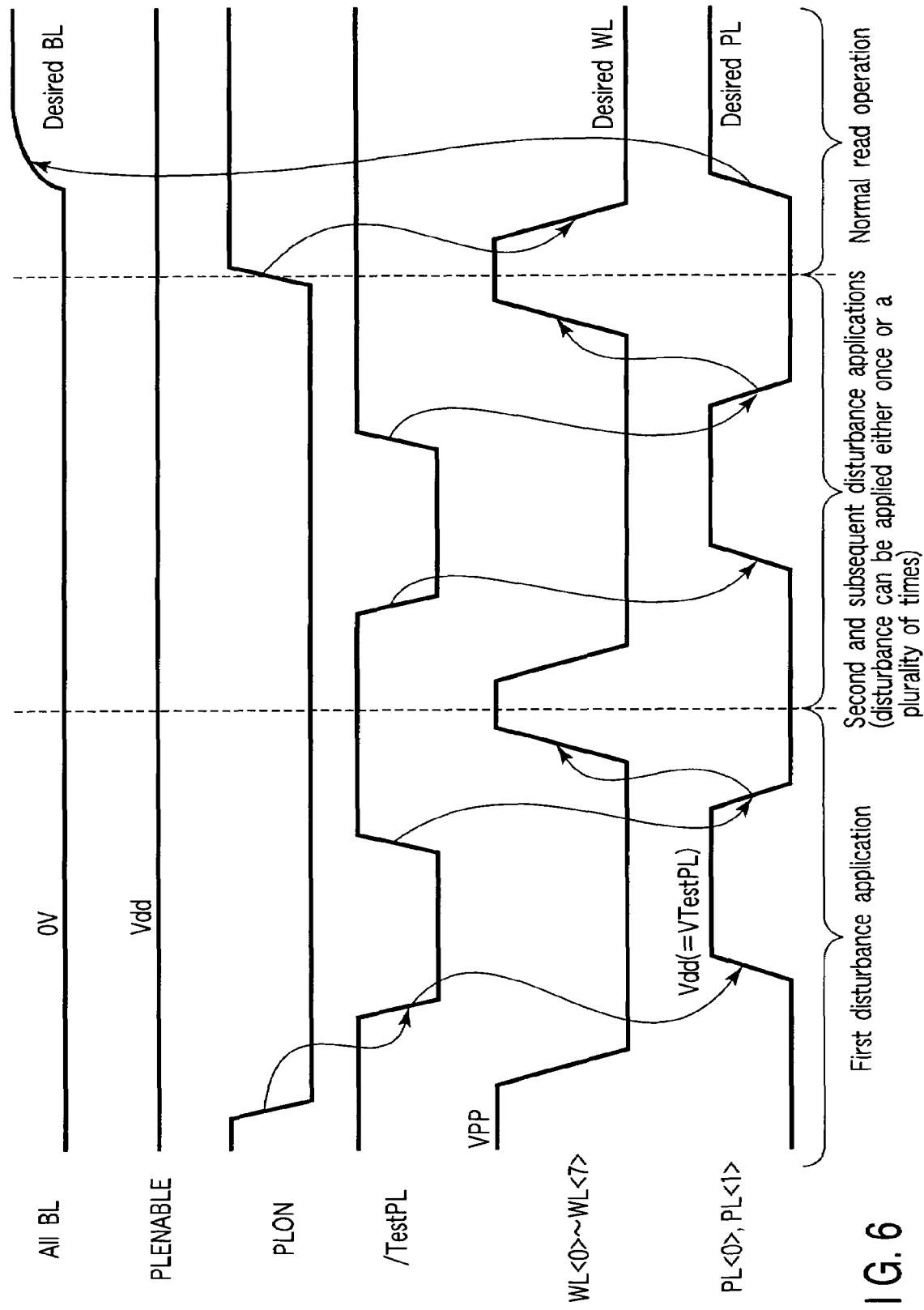
FIG. 6 is a timing chart for explaining a testing operation of the circuit shown in FIGS. 1 to 5.

FIGS. 1 to 6 are views for explaining a ferroelectric memory and a method of testing the same according to the first embodiment of the present invention. FIG. 1 is a block diagram schematically showing main parts related to the test of the ferroelectric memory. FIG. 2 is a circuit diagram showing the arrangement of a memory cell array shown in FIG. 1 by taking a TC parallel unit series-connected type ferroelectric memory as an example. FIG. 3 is a circuit diagram showing the arrangement of a sense amplifier and its periphery. FIGS. 4 and 5 illustrate a driver/controller for supplying driving potentials to plate lines and bit lines, respectively. FIG. 6 is a timing chart for explaining a test operation in the circuit shown in FIGS. 1 to 5.

The ferroelectric memory shown in FIG. 1 comprises a memory cell array 11, row decoder 12, column decoder 13, driver/controller 14, and the like. The row decoder 12 includes a word line driver (WL driver) 15 and plate line driver (PL driver) 16.

Memory cells are arrayed in the memory cell array 11, and each memory cell is connected to a word line WL, bit line BL, and plate line PL. The word lines WL and plate lines PL run in a direction to intersect the bit lines BL, e.g., in a direction perpendicular to the bit lines BL.

The word lines WL are driven by the word line driver 15, and the plate lines PL are driven by the plate line driver 16. The bit lines BL are selected by the column decoder 13, and data read out from a memory cell onto the bit line BL is transferred to a DQ line 17. Alternatively, write data supplied to the DQ line 17 is transferred to a memory cell via the bit line BL. The DQ lines 17 run along the same direction as the word lines WL and plate lines PL.

The driver/controller 14 controls driving potentials to be supplied to the plate lines and bit lines. The driver/controller 14 operates under the control of a driving potential (normal mode) VPL and testing plate line potential VTestPL for the plate lines PL supplied from the plate line driver 16, and outputs a driving signal PLATE<x> for the plate lines PL. Also, the driver/controller 14 operates under the control of a testing bit line potential VTestBL supplied from the column decoder 13, and outputs a driving signal BL<x> for the bit lines BL.

In the memory cell array 11 shown in FIG. 2, the two electrodes of a capacitor (C) are connected between the source and drain of a cell transistor (T) to form each of unit cells UC0, UC1, . . . , UC7, and the unit cells UC0, UC1, . . . , UC7 are connected in series (this memory is called a TC parallel unit series-connected type ferroelectric memory). The series-connected unit cells UC0, UC1, . . . , UC7 form each of blocks GUC0, GUC1, GUC2, . . . . Terminals on one end of the blocks GUC0, GUC1, GUC2, . . . are connected to bit lines BL<0>, BL<1>, BL<2>, . . . via the current paths of block selection MOS transistors BS<0>, BS<1>, BS<2>, respectively, and the other terminals are alternately connected to plate lines PL<0> and PL<1>. The gates of the cell transistors T are connected to word lines WL<0>, WL<1>, WL<2>, . . . in each row.

Note that in FIG. 2, the polarization directions of the capacitor C are represented by a pair of plus (+) and minus (−) signs, and these signs are enclosed within a circle.

FIG. 3 shows the circuit configuration of a sense amplifier (S/A) and its periphery by taking the bit lines BL<0> and BL<1> (a bit line pair) complementary to each other as examples. The current path of an equalizing MOS transistor Q1 is connected between the bit lines BL<0> and BL<1>. Also, between the bit lines BL<0> and BL<1>, a column select line SCL<0> runs along the direction in which the bit lines BL<0> and BL<1> run. The current path of an equalizing MOS transistor Q2 is connected between the column select line CSL<0> and bit line BL<0>, and the current path of an equalizing MOS transistor Q3 is connected between the column select line CSL<0> and bit line BL<1>. An equalizing signal EQL is supplied to the gates of the MOS transistors Q1 to Q3 from a signal line 21 running in a direction to intersect (e.g., a direction perpendicular to) the bit lines BL<0> and BL<1>.

The current path of a MOS transistor Q4 is connected between the bit line BL<0> and column select line CSL<0>. A signal TestWL<0> is supplied to the gate of the MOS transistor Q4 from a signal line 22A running in the direction to intersect the bit lines BL<0> and BL<1>. The current path of a MOS transistor Q5 is connected between the bit line BL<1> and column select line CSL<0>. A signal TestWL<1> is supplied to the gate of the MOS transistor Q5 from a signal line 22B running in a direction parallel to the signal line 22A.

In addition, a sense amplifier (S/A) 23 is connected between the bit lines BL<0> and BL<1> to amplify the potential difference between them.

A /DQ line 24A and DQ line 24B run in the direction to intersect the bit lines BL<0> and BL<1>. The current path of a MOS transistor Q6 is connected between the bit line BL<0> and DQ line 24B, and the gate of the MOS transistor Q6 is connected to the column select line CSL<0>. Similarly, the current path of a MOS transistor Q7 is connected between the bit line BL<1> and /DQ line 24A, and the gate of the MOS transistor Q7 is connected to the column select line CSL<0>. A DQ line sense amplifier (DQ S/A) 25 is connected between the /DQ line 24A and DQ line 24B to amplify the potential difference between them.

A transfer gate TG0 is connected between the bit line BL<0> and a signal line ExtVBL<0> for externally supplying a bit line driving potential in the normal mode to the bit line. A transfer gate TG1 is connected between the bit line BL<1> and a signal line ExtVBL<1> for externally supplying a bit line driving potential in the normal mode to the bit line. The transfer gate TG0 is formed by connecting the current paths of a P-channel MOS transistor Q8 and N-channel MOS transistor Q9 in parallel. A signal /ExtON<0> is supplied to the gate of the MOS transistor Q8, and a signal ExtON<0> is supplied to the gate of the MOS transistor Q9. Likewise, the transfer gate TG1 is formed by connecting the current paths of a P-channel MOS transistor Q10 and N-channel MOS transistor Q11 in parallel. A signal /ExtON<1> is supplied to the gate of the MOS transistor Q10, and a signal ExtON<1> is supplied to the gate of the MOS transistor Q11.

A signal line 26 to which a signal VSA is transferred, a signal line 27 to which the testing bit line potential VTestBL is transferred, and a power line 28 for a ground potential Vss run in the direction to intersect the bit lines BL<0> and BL<1>.

FIG. 4 shows a circuit, as a part of the driver/controller 14, which supplies a driving potential to the plate line PL. This circuit includes NAND gates 31 to 35, inverters 36 to 39, P-channel MOS transistors Q12 and Q13, and an N-channel MOS transistor Q14. The input terminal of the NAND gate 31 is supplied with a row address signal RowAdd.<x>, a plate line enable signal PLENABLE, and a signal PLON for designating the normal mode or test mode. The output signal from the NAND gate 31 is supplied to the input terminal of the inverter 36, and the output signal from the inverter 36 is supplied to the input terminal of the inverter 37. The output signal from the inverter 37 is supplied to the gate of the MOS transistor Q12. The driving potential VPL for the plate line PL is applied from the plate line driver 16 to the source of the MOS transistor Q12.

The input terminal of the NAND gate 32 is supplied with the row address signal RowAdd.<x> and a plate line test signal TestPL. The output signal from the NAND gate 32 is supplied to the input terminal of the inverter 38, and the output signal from the inverter 38 is supplied to the input terminal of the inverter 39. The output signal from the inverter 39 is supplied to the gate of the MOS transistor Q13. The source of the MOS transistor Q13 is supplied with the testing plate line potential VTestPL from the plate line driver 16. The drain of the MOS transistor Q13 is connected to the drain of the MOS transistor Q12.

The input terminal of the NAND gate 33 is supplied with the plate line enable signal PLENABLE and the signal PLON for designating the normal mode or test mode. The output signal from the NAND gate 33 and an inverted signal /TestPL of the plate line test signal TestPL are supplied to the NAND gate 34. The output signal from the NAND gate 34 and the row address signal RowAdd.<x> are supplied to the NAND gate 35. The output signal from the NAND gate 35 is supplied to the gate of the MOS transistor Q14. The MOS transistor Q14 has a drain connected to the drains of the MOS transistors Q12 and Q13, and a source connected to a ground point Vss. The drains of the MOS transistors Q12, Q13, and Q14 output the signal PLATE<x> for driving the plate line PL.

FIG. 5 shows a circuit, as a part of the driver/controller 14, which supplies the driving potential to the bit line BL. This circuit includes NAND gates 40 and 41, an inverter 42, a NOR gate 43, and N-channel MOS transistors Q15 and Q16. The input terminal of the NAND gate 40 is supplied with a column address signal ColAdd.<x>, bit line equalizing signal /EQL, and bit line test signal TestBL. The output signal from the NAND gate 40 is supplied to the input terminal of the inverter 42. The output signal from the inverter 42 is supplied to the gate of the MOS transistor Q15. The testing bit line potential VTestBL is applied to the drain of the MOS transistor Q15 from the column decoder 13.

The NOR gate 43 is supplied with a bit line equalizing signal EQL (an inverted signal of the signal /EQL) and a bit line test signal /TestBL (an inverted signal of the signal TestBL). The output signal from the NOR gate 43 and the column address signal ColAdd.<x> are supplied to the NAND gate 41. The output signal from the NAND gate 41 is supplied to the gate of the MOS transistor Q16. The MOS transistor Q16 has a drain connected to the source of the MOS transistor Q15, and a source connected to the ground point Vss. The signal BL<x> for driving the bit line BL is output from the connecting point between the source of the MOS transistor Q15 and the drain of the MOS transistor Q16.

In the above arrangement, an outline of the test operation is executed following the procedures as indicated by steps A to H below, as in Jpn. Pat. Appln. KOKAI Publication No. 2002-313100.

(A) Conduct a function test, and calculate the yield
(B) Write initial pattern data
(C) Bake
(D) Calculate the SS yield (same state yield) by reading out the initial pattern data
(E) Write reverse pattern data
(F) Apply a microvoltage equal to or lower than a coercive voltage to a plurality of cell capacitors at the same time in a direction to weaken polarization
(G) Read out the reverse data pattern, and calculate the OS yield (opposite state yield)
(H) Write the next pattern That is, before the test of reading out the reverse data pattern in step G, the microvoltage equal to or lower than the coercive voltage is applied in the direction to weaken the polarization of a plurality of cell capacitors at the same time. Since step F is executed, however, even a large amount of residual polarization which requires a long time to depolarize attenuates, and this is effectively equivalent to performing depolarization within a short time period. Accordingly, a low read voltage equivalent to the amount of polarization after depolarization is output to a bit line.

Also, a cell having a low coercive voltage fails by polarization reversal when the microvoltage is applied in step F. Accordingly, a ferroelectric cell having a hysteresis curve with a low coercive voltage can be screened.

As described above, it is possible to give the amount of polarization equal to that after a cell capacitor has depolarized within a short time period, and perform the test in step G for polarized data which has effectively depolarized.

The procedures of the test operation will be explained below with reference to FIG. 6. FIG. 6 is a timing chart for explaining the operation of the circuit shown in FIGS. 1 to 5, in which operating waveforms in the test mode are illustrated.

First, as shown in FIG. 2, all the bit lines BL<0>, BL<1>, BL<2>, BL<3>, . . . (All BL) are set at 0V to prepare for application of a voltage ΔV to the two electrodes of each ferroelectric capacitor (cell capacitor). In this state, the signal PLENABLE is at a power supply potential Vdd.

Subsequently, the signal PLON is changed to Low level to start not a normal mode operation but a plate line driving operation in the test mode. Since the signal PLENABLE is High level and the signal PLON is Low level, the output from the NAND gate 31 changes to High level to turn off the MOS transistor Q12, regardless of the row address signal RowAdd.<x>.

Also, all the eight word lines WL<0> to WL<7> are selected (changed to Low level) to turn off the cell transistors T. Accordingly, a voltage can be applied between the two electrodes of each of the cell capacitors in the blocks GUC0, GUC1, GUC2, . . . .

After that, in response to the change of the signal /TestPL to Low level, both the plate lines PL<0> and PL<1> are pulse-driven to the Vdd level (=VTestPL). When the signal /TestPL changes from High level to Low level (when the signal TestPL changes from Low level to High level), the output from the NAND gate 32 changes to Low level to turn on the MOS transistor Q13, if the row address signal RowAdd.<x> is High level.

On the other hand, High level of the signal PLENABLE and Low level of the signal PLON change the output from the NAND gate 33 to High level, and Low level of the signal /TestPL changes the output from the NAND gate 34 to High level. Also, when the row address signal RowAdd.<x> is High level, the output signal from the NAND gate 35 changes to Low level to turn off the MOS transistor Q14.

Consequently, VTestPL (Vdd) is supplied to the plate lines PL<0> and PL<1> via the MOS transistor Q13.

In a situation in which, e.g., no imprint has occurred immediately after film formation, the capacitive components of all cells are presumably equal in the "all 1" pattern as shown in FIG. 2. Therefore, a disturbance voltage (first time) indicated by $$\Delta V = (\frac{1}{8}) \times Vdd$$

in a direction to weaken polarization is equally applied to all the cells.

Then, the signal /TestPL is changed to High level to return the plate lines PL<0> and PL<1> to the Vss level (e.g., 0V), and a high voltage VPP is applied to the word lines WL<0> to WL<7> to turn on the cell transistors T, thereby shortcircuiting the two electrodes of each cell capacitor C to discharge, and it resets to a Vss level. In response to the change of the signal /TestPL from High level to Low level, the plate lines PL<0> and PL<1> are pulse-driven to the Vdd level again. In this manner, a second disturbance voltage is applied.

Although the disturbance voltage is applied once in this embodiment, it may also be applied continuously applied twice or more where necessary. The number of times of voltage application can be selected in accordance with the necessary characteristics or required characteristics.

When the application of the disturbance voltage is completed, the plate lines PL<0> and PL<1> return to the Vss level, and the high voltage VPP is applied to the word lines WL<0> to WL<7> to turn on the cell transistors T, thereby shortcircuiting the two electrodes of each cell capacitor C to discharge, and it resets to a Vss level. When the signal PLON changes to High level to designate a normal read operation, a selected word line (Desired WL) changes to Low level. Also, a selected plate line (Desired PL) is set at a read potential (High level), a potential of a selected bit line (Desired BL) is determined by reading the polarization of ferroelectric cell.

In the ferroelectric memory and the method of testing the same as described above, the disturbance voltage ΔV in the direction to weaken polarization can be applied to all the eight capacitors at once. This makes it possible to increase the test speed, shorten the test time, and reduce the test cost.

In addition, it is unnecessary to add any new generator for generating a microvoltage equivalent to the disturbance voltage ΔV, or to externally apply this voltage.

Accordingly, it is possible to obtain a ferroelectric memory and a method of testing the same which can increase the test speed and simplify the test.

Second Embodiment

In the first embodiment described above, after the plate lines PL<0> and PL<1> are pulse-driven to the Vdd level, the potential of the word lines WL<0> to WL<1> is once raised to shortcircuit the two electrodes of each cell capacitor C, thereby resetting the potential difference to 0V. After that, the plate lines PL<0> and PL<1> are pulse-driven again.

In this method, the voltage indicated by $$\Delta V = (\frac{1}{8}) \times Vdd$$

can be reliably applied to each cell capacitor C every time.

From the viewpoint of a high-speed test alone, however, the time required to raise and drop the potential of the word lines WL<0> to WL<1> lowers the speed. The point of the second embodiment is to omit this time.

Figure 7:
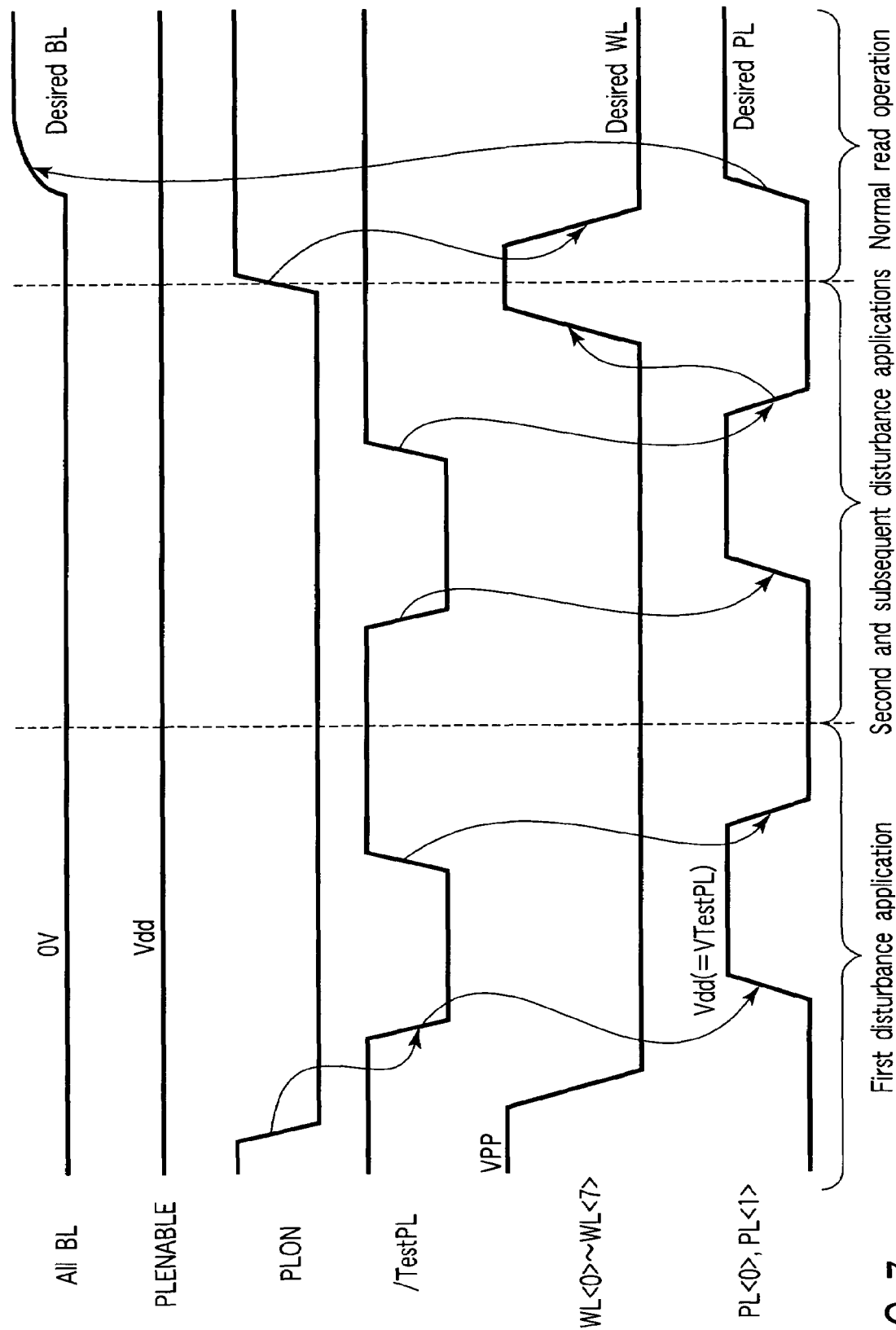
FIG. 7 is a timing chart for explaining a ferroelectric memory and the operation of a method of testing the same according to the second embodiment of the present invention.

That is, in this embodiment as shown in a timing chart of FIG. 7, when a disturbance voltage is to be applied, word lines WL<0> to WL<7> are maintained at Low level to keep cell transistors T off, and a test is conducted by repetitively pulse-driving plate lines PL<0> and PL<1> without resetting the potential difference between cell capacitors C to 0V. Since this makes it possible to omit the time required to raise and drop the potential of the word lines WL<0> to WL<7>, the test speed can be made higher than that of the first embodiment.

In this embodiment, however, at the end of the first pulse driving, a potential difference which is produced by electric charge generated when polarization reversal occurs by the application of the disturbance voltage ΔV may remain between the two electrodes of each cell capacitor C. This is so because polarization reversal normally hardly occurs unless a coercive voltage is exceeded, but a polarization region having a small coercive electric field microscopically probably exists.

Accordingly, although the second embodiment is suitable when a high speed is required, the first embodiment is preferably used if it is necessary to accurately test the hysteresis characteristics. The first and second embodiments are selectively used in accordance with the necessary characteristics or required characteristics.

Third Embodiment

Figure 8:
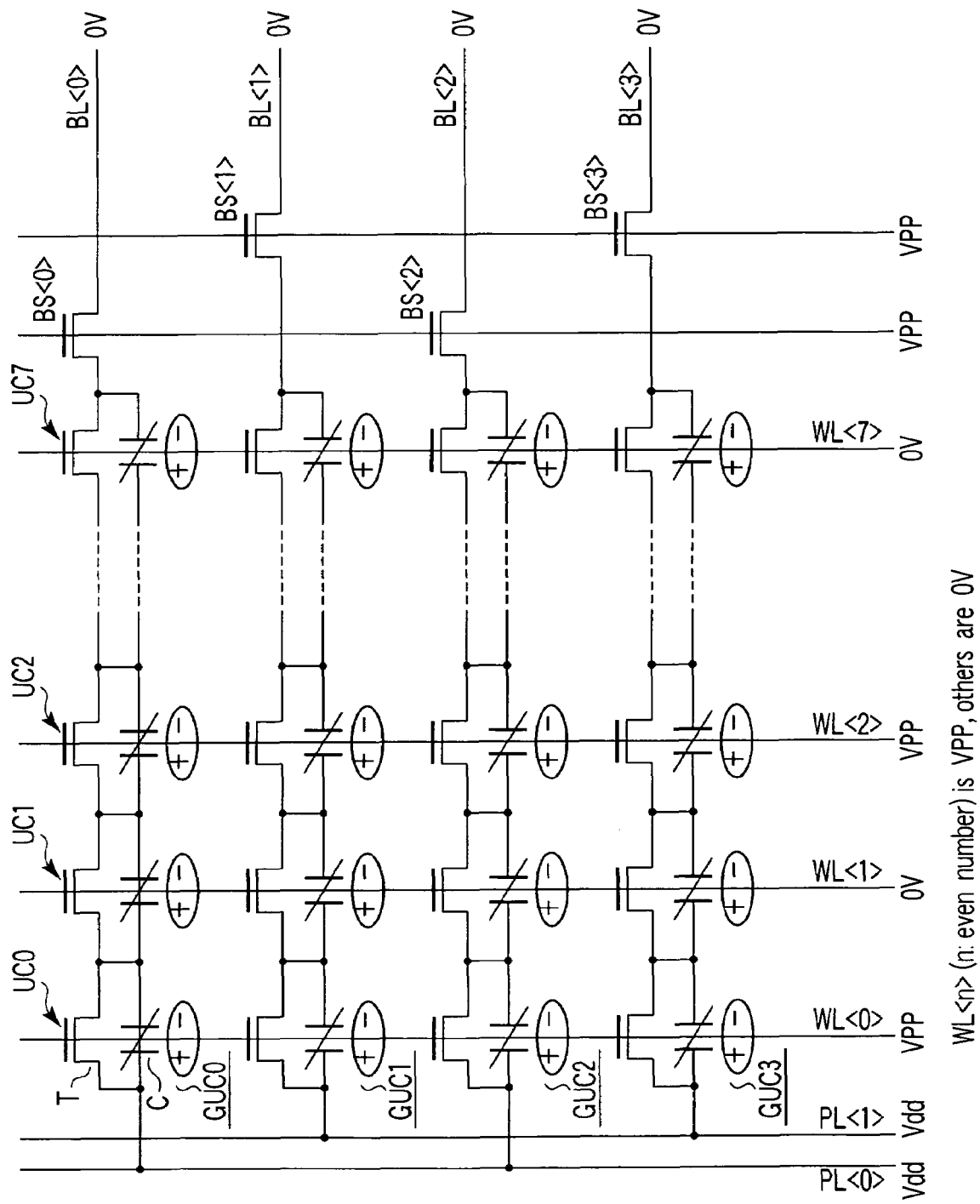
FIG. 8 is a circuit diagram for explaining a ferroelectric memory and a method of testing the same according to the third embodiment of the present invention, in which the arrangement of a memory cell array and the applied voltages are illustrated by taking a TC parallel unit series-connected type ferroelectric memory as an example.
Figure 9:
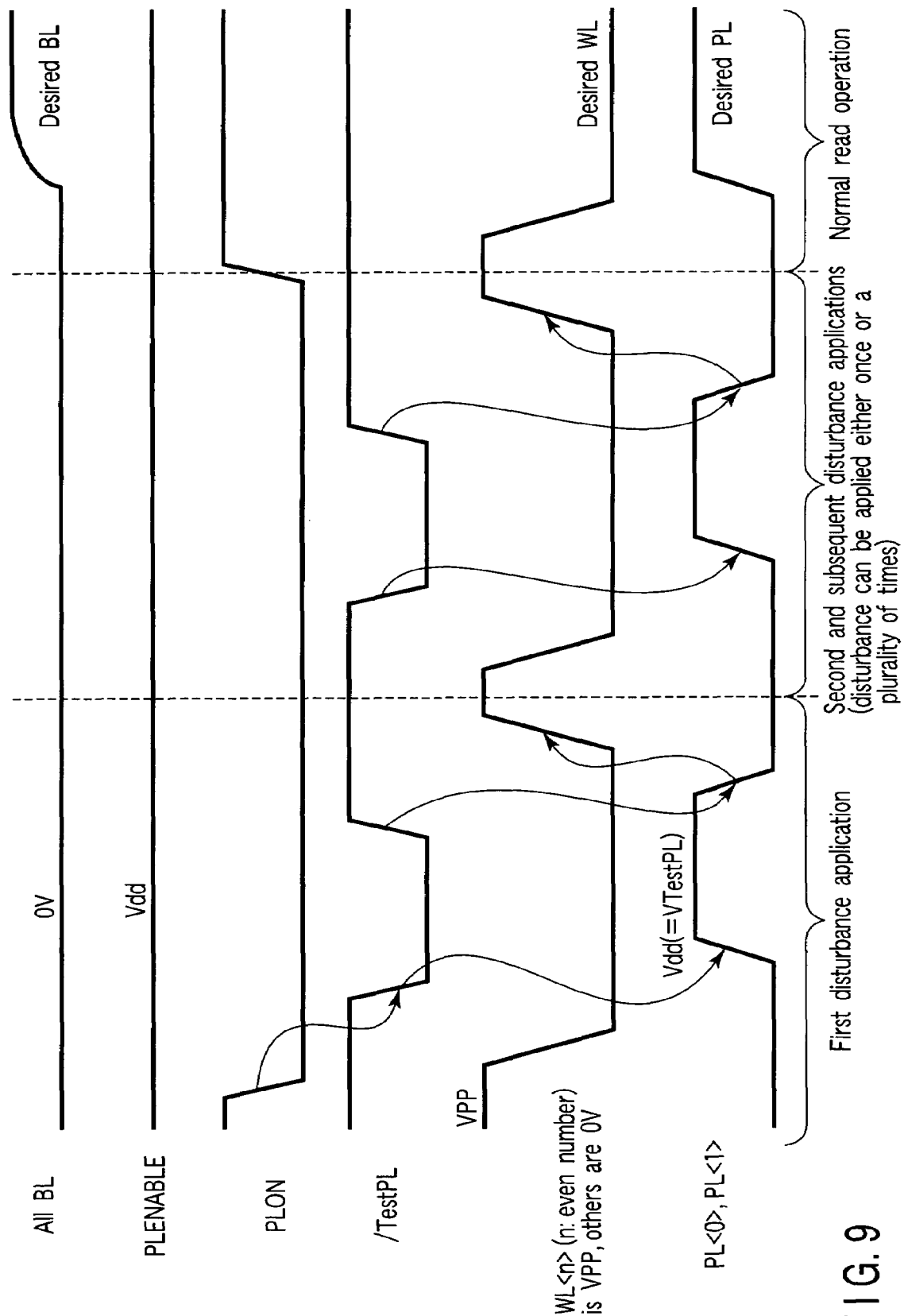
FIG. 9 is a timing chart for explaining the operation of the circuit shown in FIG. 8.

FIGS. 8 and 9 are views for explaining a ferroelectric memory and a method of testing the same according to the third embodiment of the present invention. FIG. 8 is a circuit diagram showing the arrangement of a memory cell array and the applied voltages by taking a TC parallel unit series-connected type ferroelectric memory as an example. FIG. 9 is a timing chart showing operating waveforms in a test mode.

The procedures of the test operation are the same as the first embodiment except that odd-numbered word lines are turned off (selected).

That is, in the third embodiment, when a disturbance voltage ΔV is to be applied to each cell capacitor C, four word lines WL<n> (n: even number) are turned off (selected) (others are VPP), and a Vdd level is applied to plate lines PL<0> and PL<1>, thereby applying a voltage indicated by $$\Delta V = (¼) \times Vdd$$

to each ferroelectric capacitor C. Since the disturbance voltage ΔV can be applied to all the four capacitors at once, the test speed can be increased.

Also, it is unnecessary to add any new generator for generating a voltage equivalent to the disturbance voltage ΔV, or to externally apply this voltage.

Fourth Embodiment

In the third embodiment described above, after the plate lines PL<0> and PL<1> are pulse-driven to the Vdd level, the potential of the four word lines WL<n> (n: even number) is once raised to shortcircuit the two electrodes of each ferroelectric capacitor, thereby resetting the potential difference to 0V. After that, pulse driving is performed again.

Figure 10:
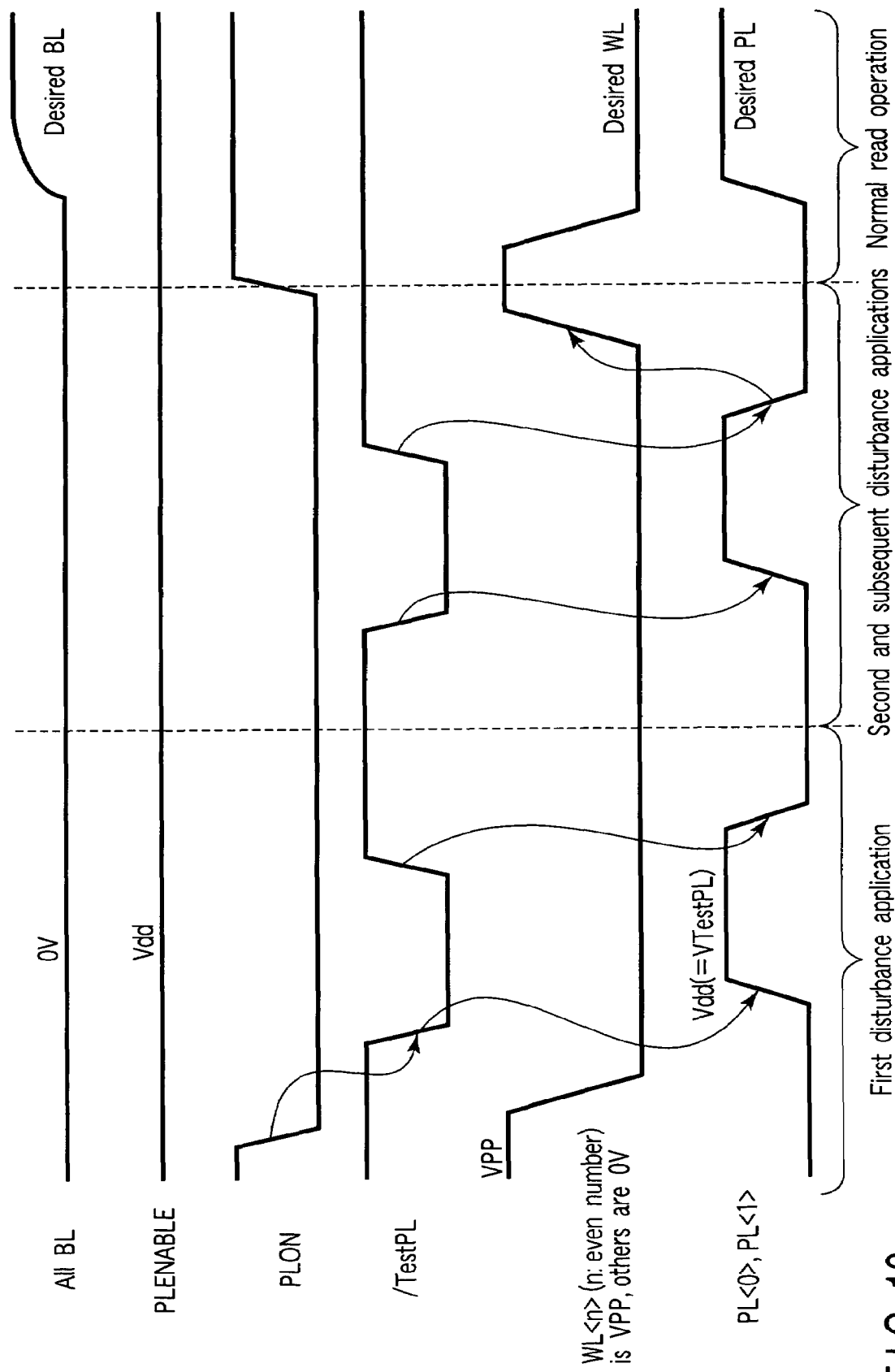
FIG. 10 is a timing chart for explaining a ferroelectric memory and the operation of a method of testing the same according to the fourth embodiment of the present invention.

As explained in the second embodiment, the time required to raise and drop the potential of the word lines WL<n> (n: even number) lowers the speed. In the fourth embodiment, therefore, as shown in FIG. 10, word lines WL<n> (n: even number) are kept off (selected) during the application period of a disturbance voltage ΔV. This gives priority to a high speed over accurately setting the applied disturbance voltage ΔV to $$\Delta V = (¼) \times Vdd$$

Fifth Embodiment

Figure 11:
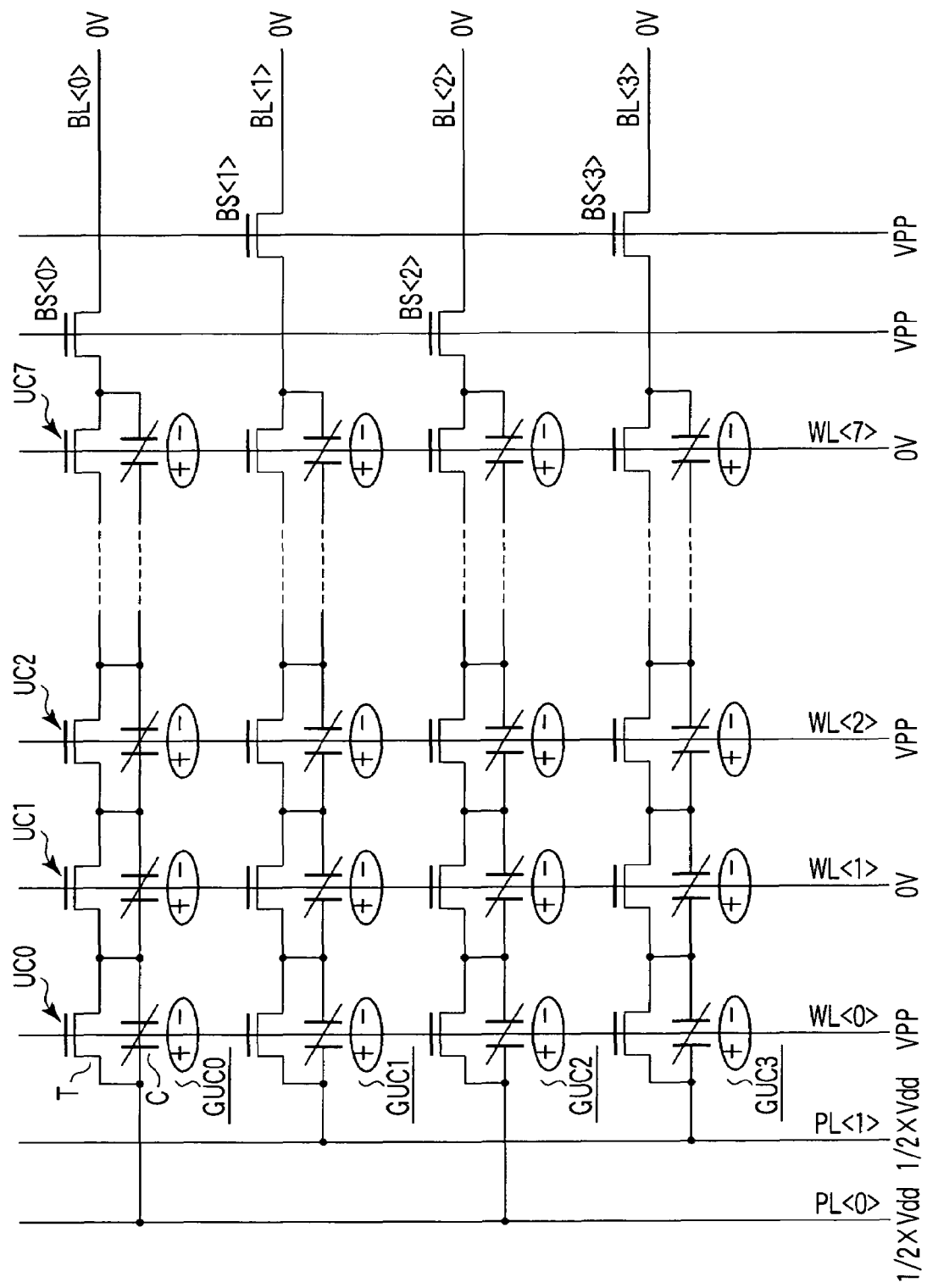
FIG. 11 is a circuit diagram for explaining a ferroelectric memory and a method of testing the same according to the fifth embodiment of the present invention, in which the arrangement of a memory cell array and the applied voltages are illustrated by taking a TC parallel unit series-connected type ferroelectric memory as an example.
Figure 12:
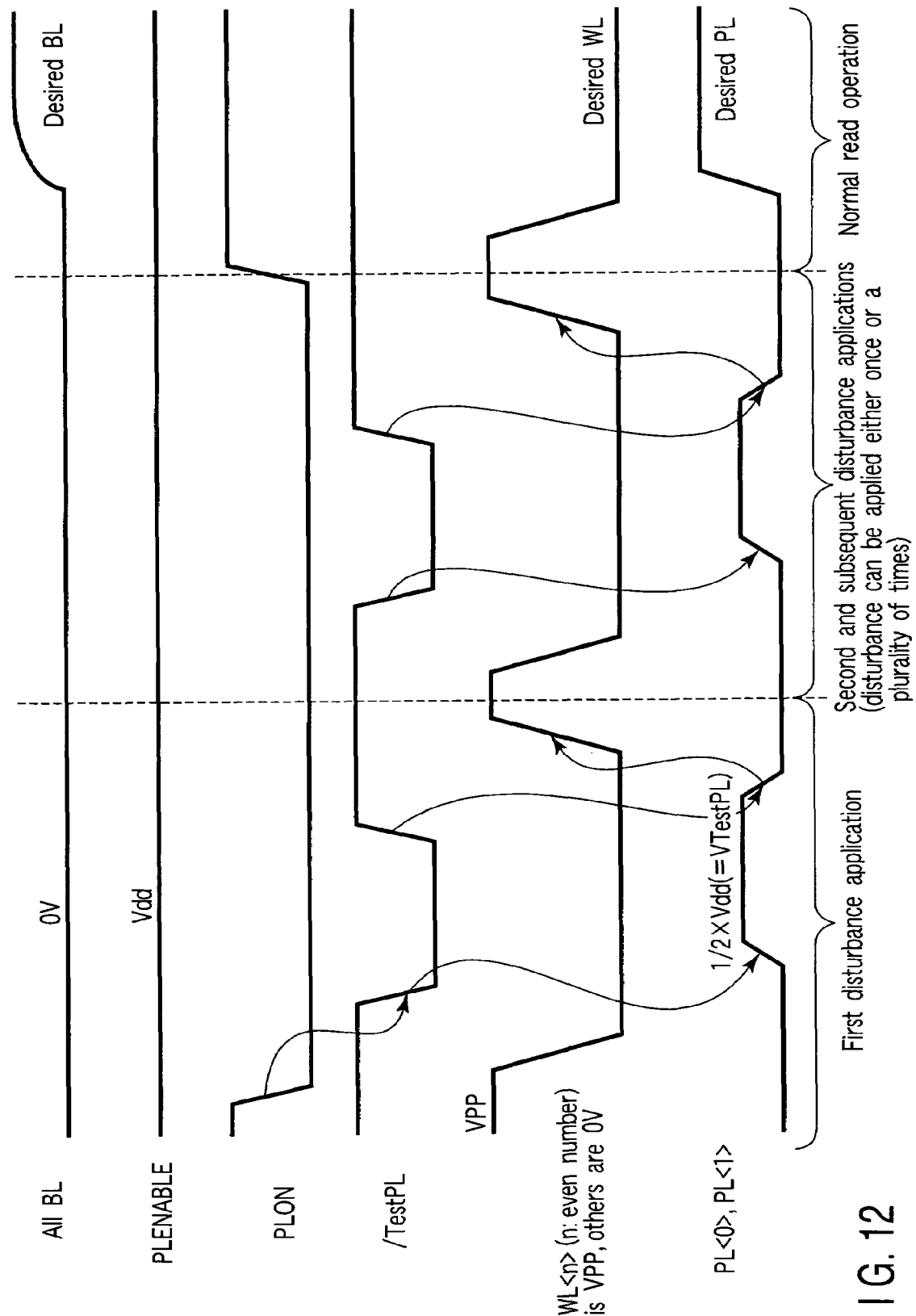
FIG. 12 is a timing chart for explaining the operation of the circuit shown in FIG. 11.

FIGS. 11 and 12 are views for explaining a ferroelectric memory and a method of testing the same according to the fifth embodiment of the present invention. FIG. 11 is a circuit diagram showing the arrangement of a memory cell array and the applied voltages by taking a TC parallel unit series-connected type ferroelectric memory as an example. FIG. 12 is a timing chart showing operating waveforms in a test mode.

The procedures of the test operation are the same as the third embodiment except that a voltage to be applied to plate lines PL<0> and PL<1> is (½)×Vdd.

In the fifth embodiment, when a disturbance voltage ΔV is to be applied to cell capacitors C, four word lines are turned off (selected), and a (½)×Vdd level is applied to the plate lines PL<0> and PL<1>, thereby applying a voltage indicated by $$\Delta V = (¼) \times (½) \times Vdd$$

to each ferroelectric capacitor. Since the disturbance voltage ΔV can be applied to all the four capacitors at once, the test speed can be increased.

Also, it is unnecessary to add any new generator for generating a voltage equivalent to the disturbance voltage ΔV, or to externally apply this voltage.

Sixth Embodiment

In the fifth embodiment described above, after the plate lines PL<0> and PL<1> are pulse-driven to the Vdd level, the potential of the four word lines WL<n> (n: even number) is once raised to shortcircuit the two electrodes of each ferroelectric capacitor, thereby resetting the potential difference to 0V. After that, pulse driving is performed again.

Figure 13:
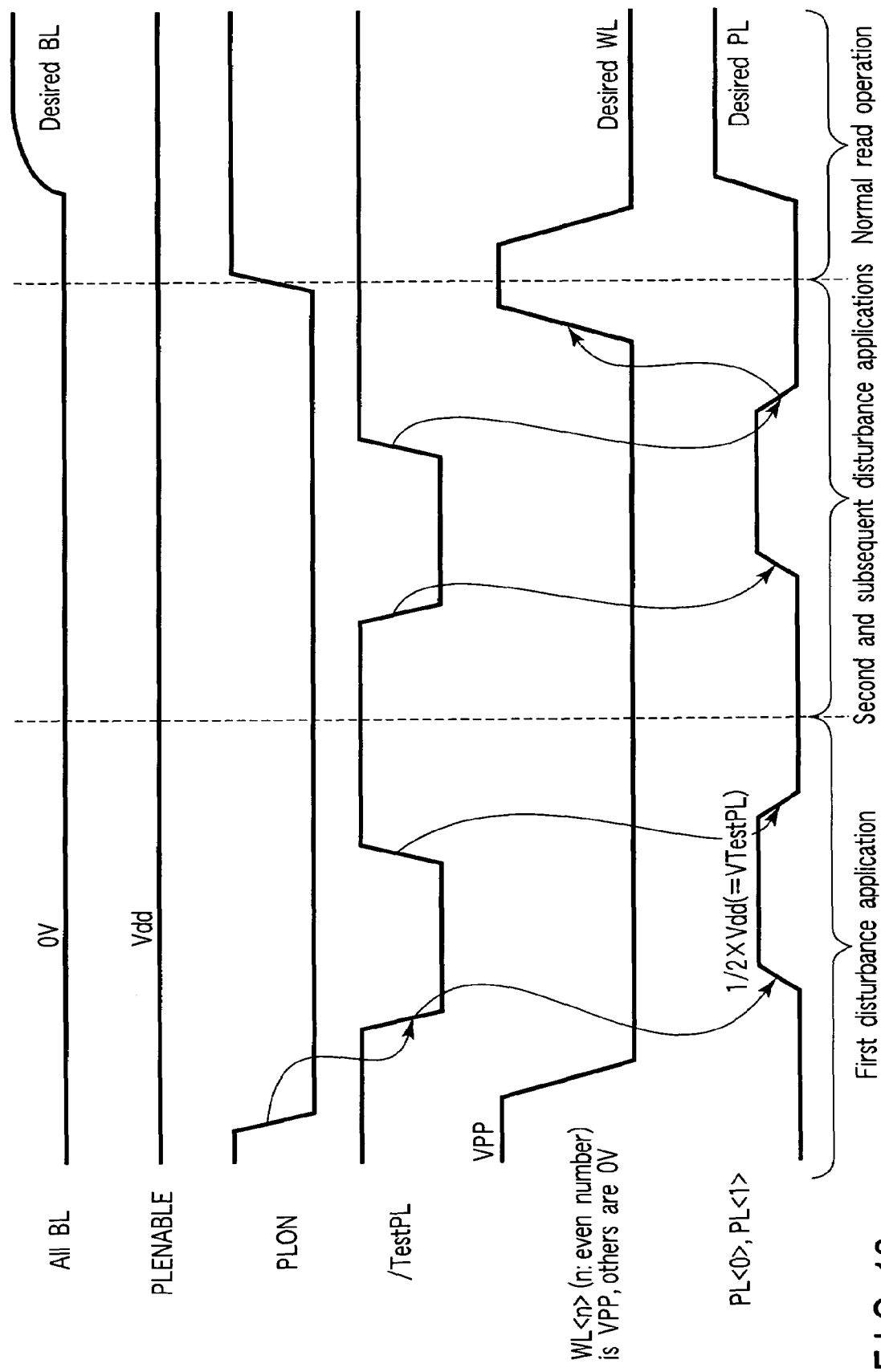
FIG. 13 is a timing chart for explaining a ferroelectric memory and the operation of a method of testing the same according to the sixth embodiment of the present invention.

In the sixth embodiment, as in the fourth embodiment, word lines WL<n> (n: even number) are kept off (selected) during the application period of a disturbance voltage ΔV as shown in FIG. 13. This gives priority to a high speed over accurately setting the applied disturbance voltage ΔV to $$\Delta V = (⅛) \times Vdd$$

Seventh Embodiment

Figure 14:
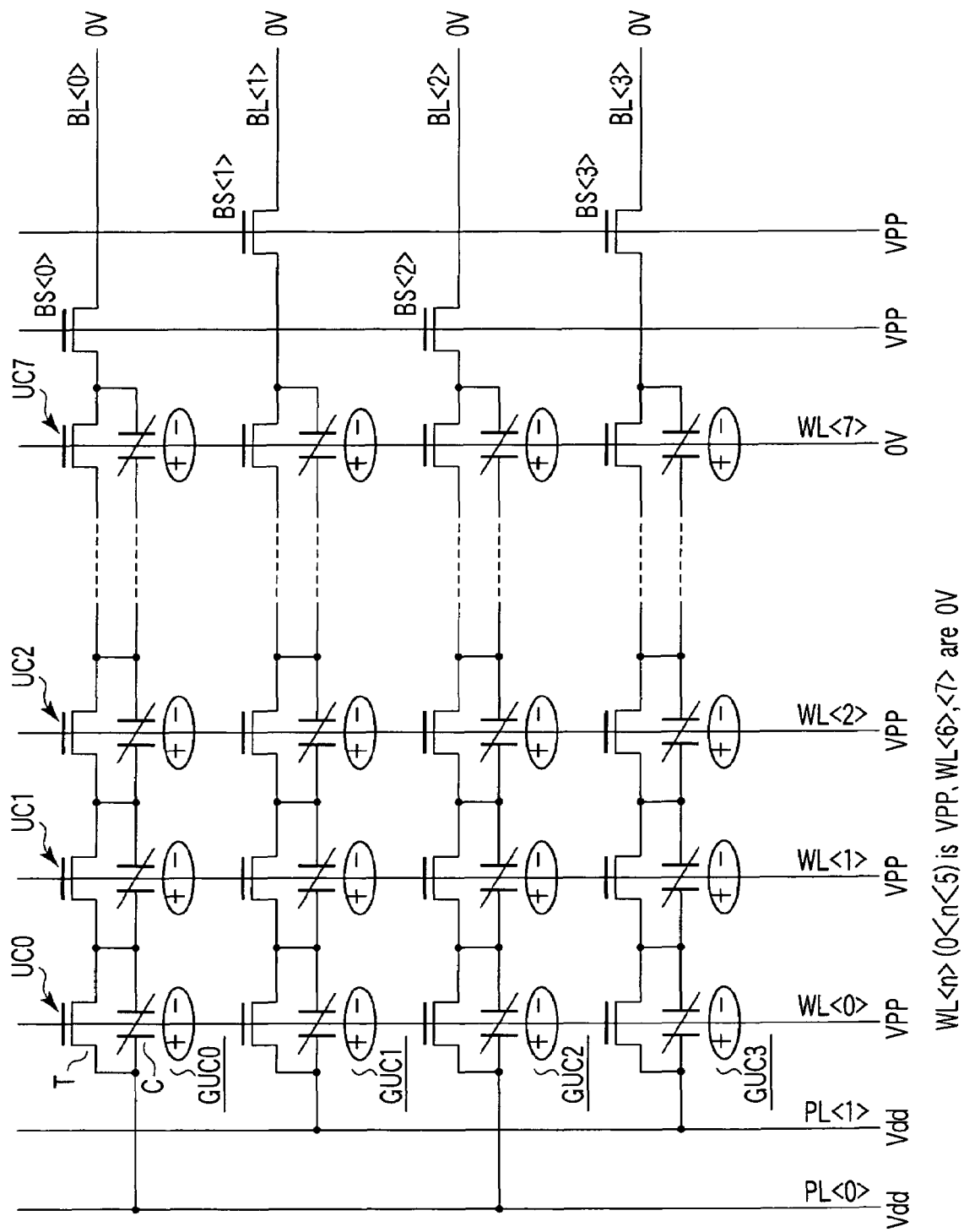
FIG. 14 is a circuit diagram for explaining a ferroelectric memory and a method of testing the same according to the seventh embodiment of the present invention, in which the arrangement of a memory cell array and the applied voltages are illustrated by taking a TC parallel unit series-connected type ferroelectric memory as an example.

FIGS. 14 and 15 are views for explaining a ferroelectric memory and a method of testing the same according to the seventh embodiment of the present invention. FIG. 14 is a circuit diagram showing the arrangement of a memory cell array and the applied voltages by taking a TC parallel unit series-connected type ferroelectric memory as an example. FIG. 15 is a timing chart showing operating waveforms in a test mode.

The procedures of the test operation are the same as the first embodiment except that word lines WL<6> and WL<7> are turned off (selected).

In the seventh embodiment, when a disturbance voltage ΔV is to be applied to cell capacitors, the two word lines WL<6> and WL<7> are turned off (selected), and a Vdd level is applied to plate lines PL<0> and PL<1>, thereby applying a voltage indicated by $$\Delta V = (½) \times Vdd$$

to each ferroelectric capacitor. Since the disturbance voltage ΔV is applied to the two capacitors at same time, the test speed can be increased.

Also, it is unnecessary to add any new generator for generating a voltage equivalent to the disturbance voltage ΔV, or to externally apply this voltage.

Eighth Embodiment

In the seventh embodiment described above, after the plate lines are pulse-driven, the word lines are once raised to shortcircuit the two electrodes of each ferroelectric capacitor, thereby resetting the potential difference to 0V. After that, pulse driving is performed again.

In the eighth embodiment, as in the second embodiment described earlier, a high speed is given priority over accurately setting the applied disturbance voltage ΔV to $$\Delta V = (½) \times Vdd$$

Figure 16:
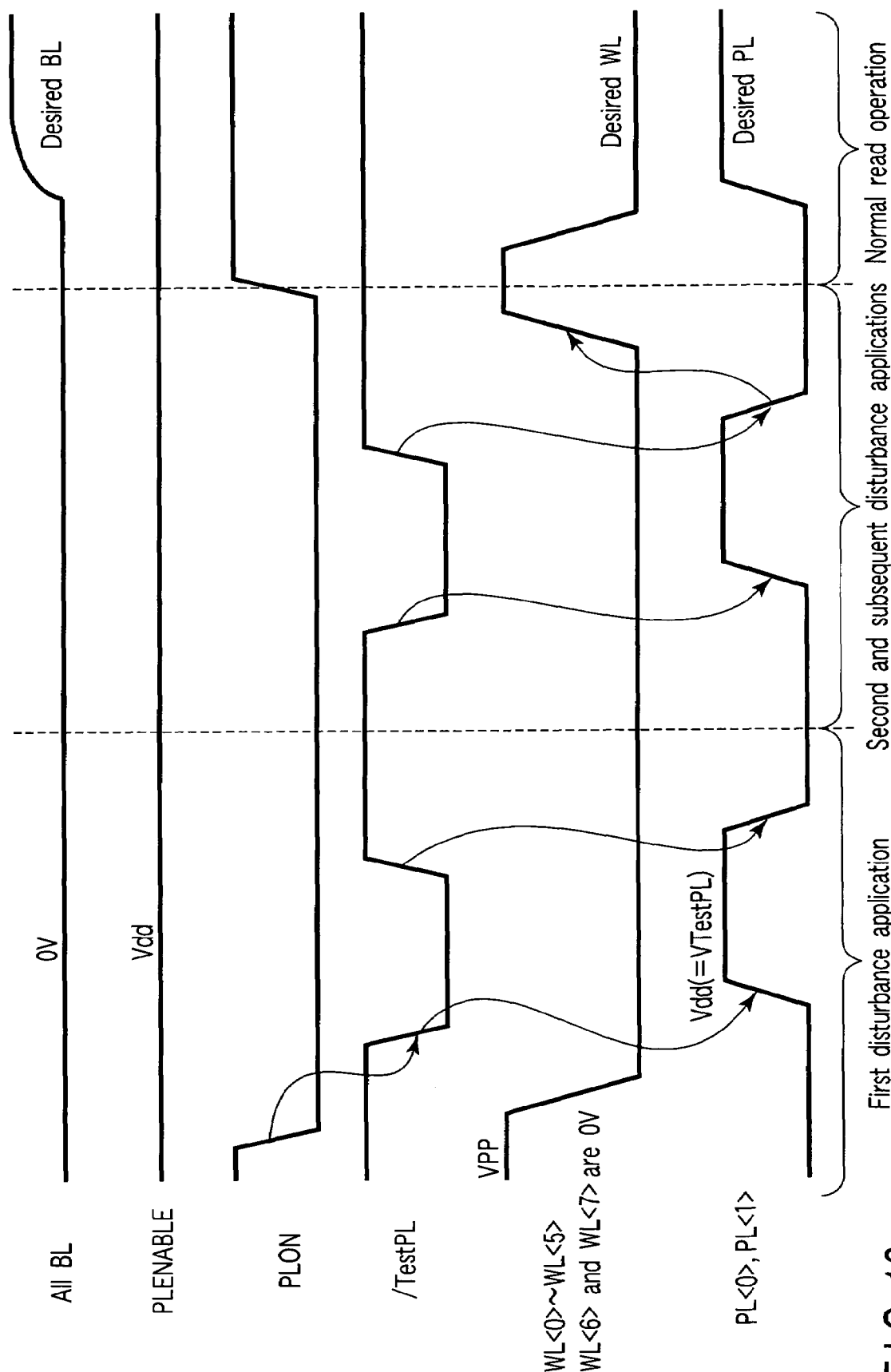
FIG. 16 is a timing chart for explaining a ferroelectric memory and the operation of a method of testing the same according to the eighth embodiment of the present invention.

The eighth embodiment is substantially the same as the seventh embodiment. That is, in the arrangement of the memory cell array shown in FIG. 14, as shown in a timing chart of FIG. 16, the eighth embodiment can be implemented by keeping word lines WL<6> and WL<7> off (selected) during the application period of a disturbance voltage ΔV.

Ninth Embodiment

Figure 17:
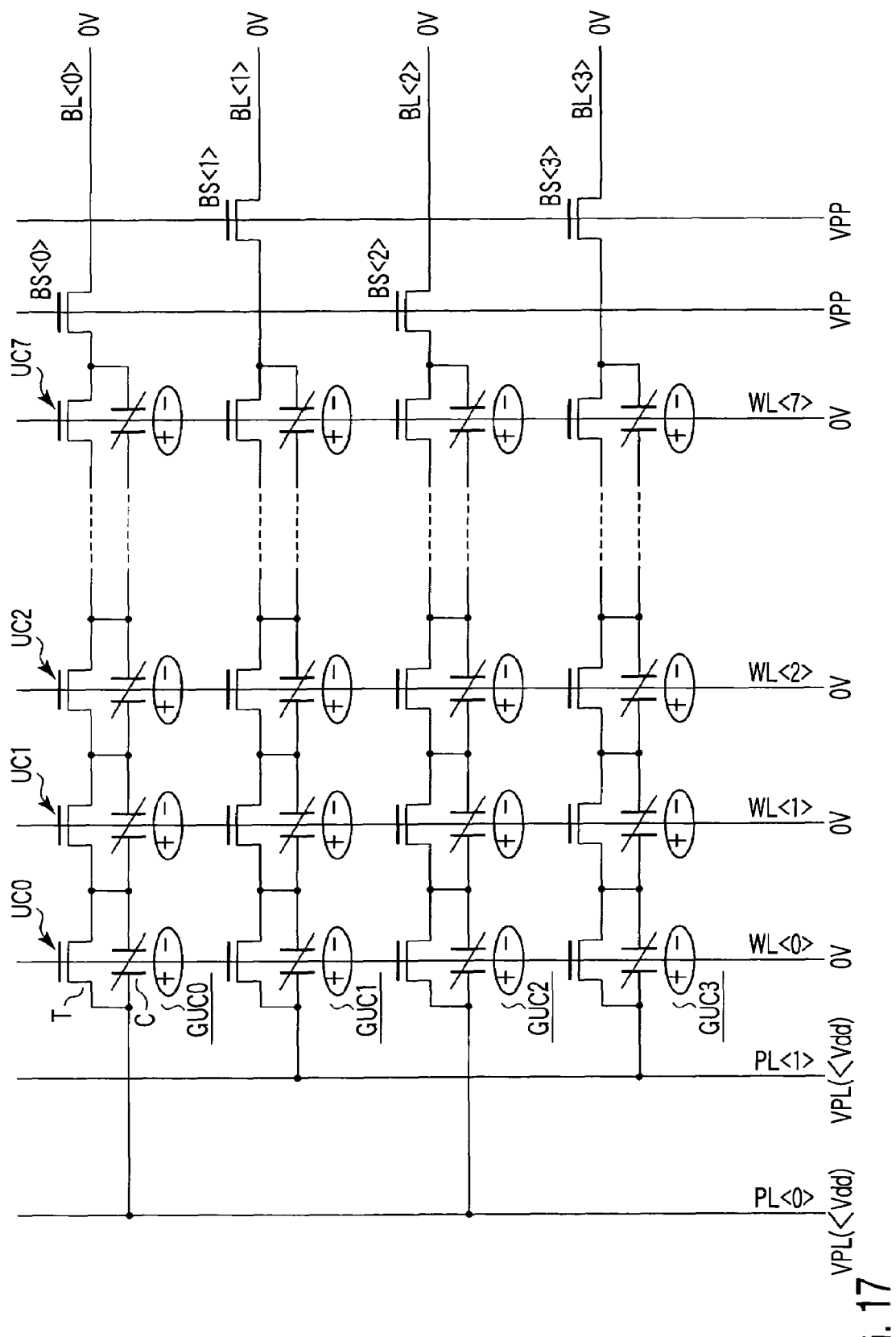
FIG. 17 is a circuit diagram for explaining a ferroelectric memory and a method of testing the same according to the ninth embodiment of the present invention, in which the arrangement of a memory cell array and the applied voltages are illustrated by taking a TC parallel unit series-connected type ferroelectric memory as an example.
Figure 18:
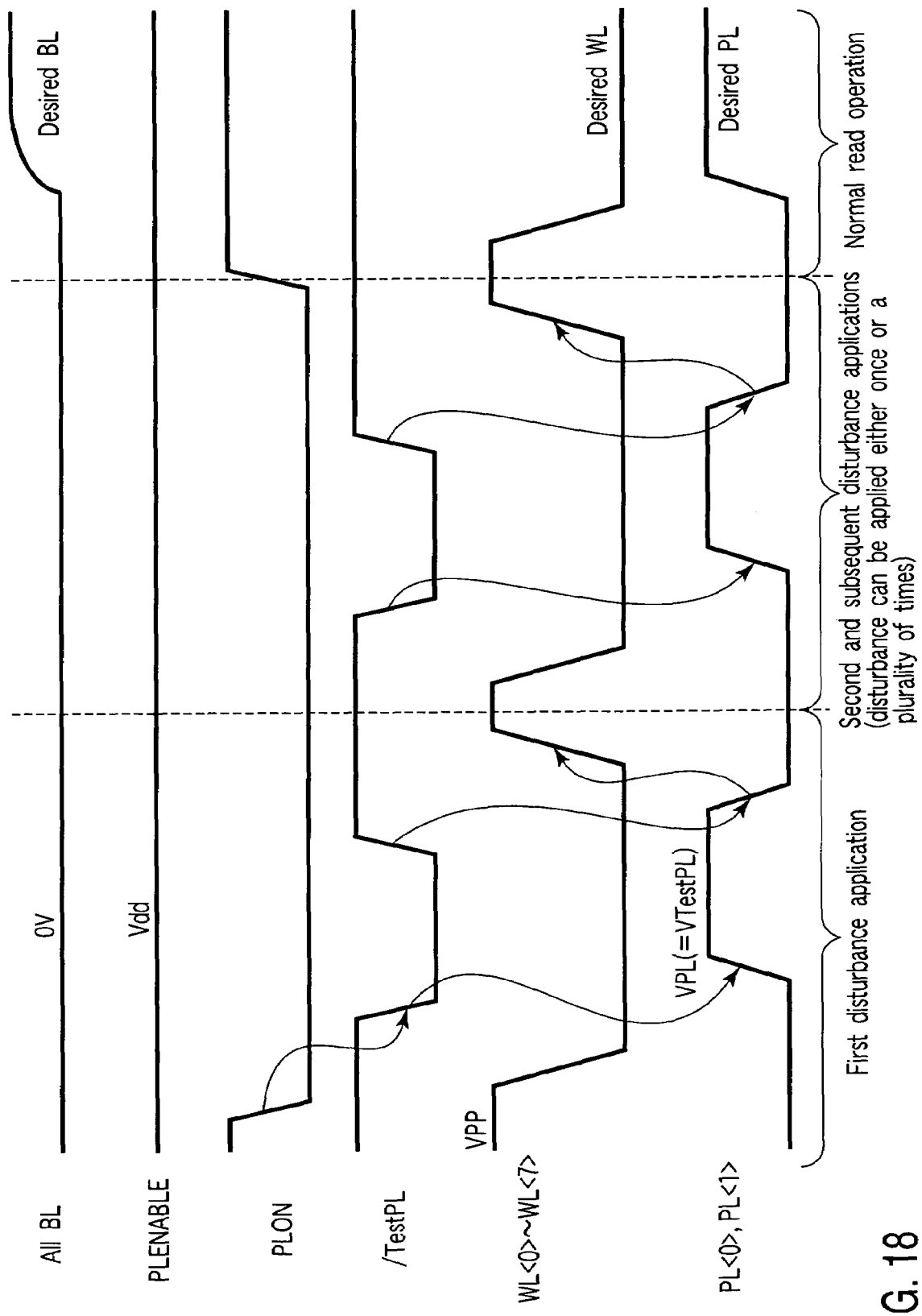
FIG. 18 is a timing chart for explaining the operation of the circuit shown in FIG. 17.

FIGS. 17 and 18 are views for explaining a ferroelectric memory and a method of testing the same according to the ninth embodiment of the present invention. FIG. 17 is a circuit diagram showing the arrangement of a memory cell array and the applied voltages by taking a TC parallel unit series-connected type ferroelectric memory as an example. FIG. 18 is a timing chart showing operating waveforms in a test mode.

In the ninth embodiment, when a disturbance voltage ΔV is to be applied to cell capacitors, eight word lines WL<0> to WL<7> are turned off (selected), and a plate line driving potential VPL (=VTestPL) in a normal mode is applied to plate lines PL<0> and PL<1>, thereby applying a voltage indicated by $$\Delta V = (1/8) \times VPL$$

to each ferroelectric capacitor. Since the disturbance voltage ΔV is applied to the eight capacitors at once, the test speed can be increased.

Also, it is unnecessary to add any new generator for generating a voltage equivalent to the disturbance voltage ΔV, or to externally apply this voltage.

The procedures of the test operation will be explained below with reference to the timing chart shown in FIG. 18.

First, as shown in FIG. 17, all bit lines BL<0>, BL<1>, BL<2>, BL<3>, . . . (All BL) are set at 0V to prepare for application of the voltage ΔV to the two electrodes of each cell capacitor C. In this state, a signal PLENABLE is at a power supply potential Vdd.

Subsequently, a signal PLON is changed to Low level to start not a normal mode operation but a plate line driving operation in the test mode.

Also, all the eight word lines WL<0> to WL<7> are turned off (selected) to allow application of the voltage to all the cell capacitors.

After that, in response to the change of a signal /TestPL to Low level, the plate lines PL<0> and PL<1> are pulse-driven at a potential VPL (=VTestPL).

In a situation in which, e.g., no imprint has occurred immediately after film formation, the capacitive components of all cells are presumably equal in the "all 1" pattern as shown in FIG. 17. Therefore, a disturbance voltage indicated by $$\Delta V = (1/8) \times VPL$$

in a direction to weaken polarization is equally applied to all the cells.

Note that although FIG. 18 shows the case in which the disturbance voltage is applied twice, it may also be applied once or continuously applied three times or more where necessary.

10th Embodiment

In the ninth embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V = (1/8) \times VPL$$

is reliably applied to each cell capacitor every time.

Figure 19:
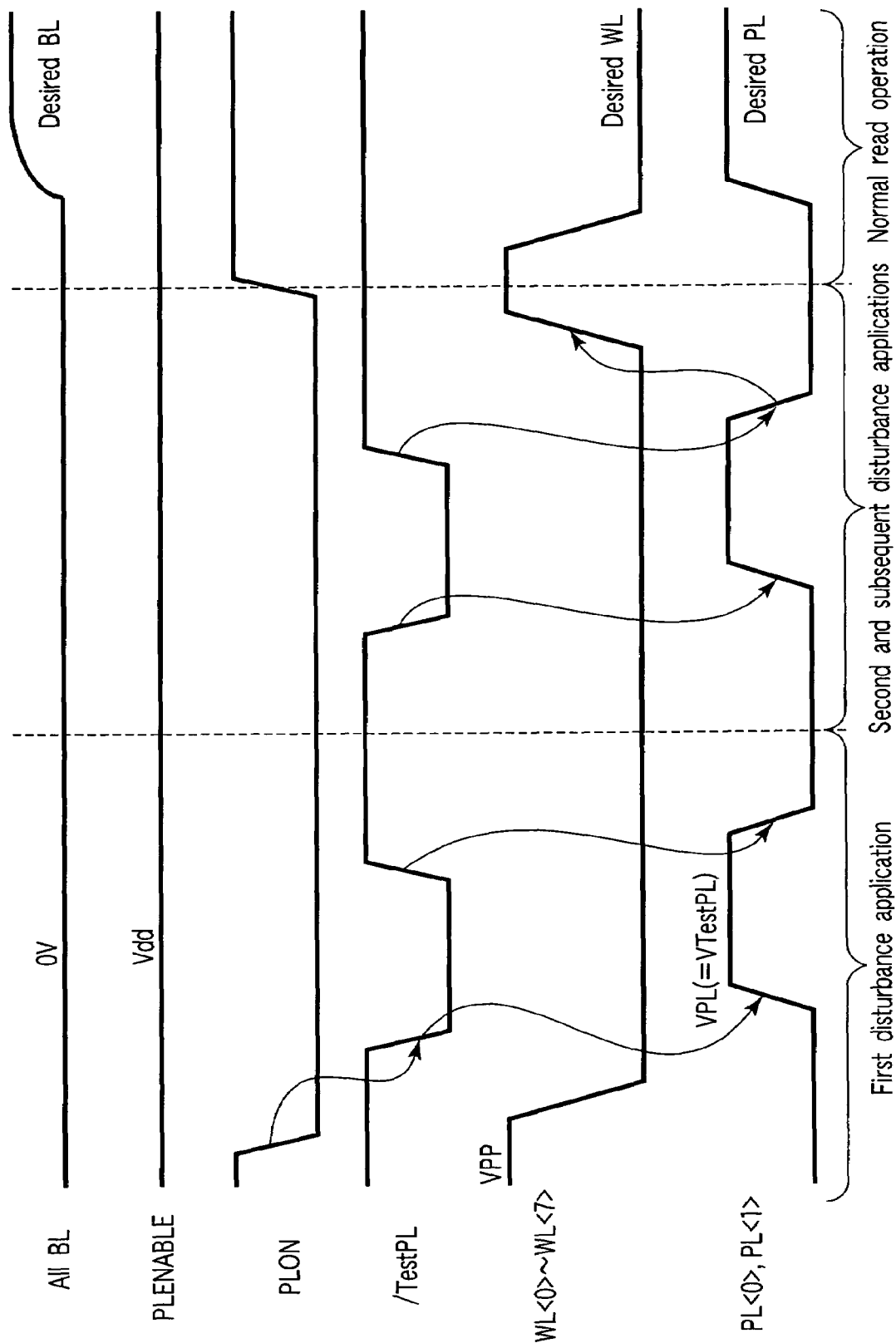
FIG. 19 is a timing chart for explaining a ferroelectric memory and the operation of a method of testing the same according to the 10th embodiment of the present invention.

From the viewpoint of a high-speed test, however, the time required to raise and drop the word line potential lowers the speed. In the 10th embodiment, therefore, as shown in FIG. 19, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage ΔV may remain between the two electrodes of each cell capacitor. This is so because polarization reversal normally hardly occurs unless a coercive voltage is exceeded, but a polarization region having a small coercive electric field microscopically probably exists.

Accordingly, although the 10th embodiment is suitable when a high speed is required, the ninth embodiment is preferably used if it is necessary to test accurate hysteresis characteristics.

11th Embodiment

Figure 20:
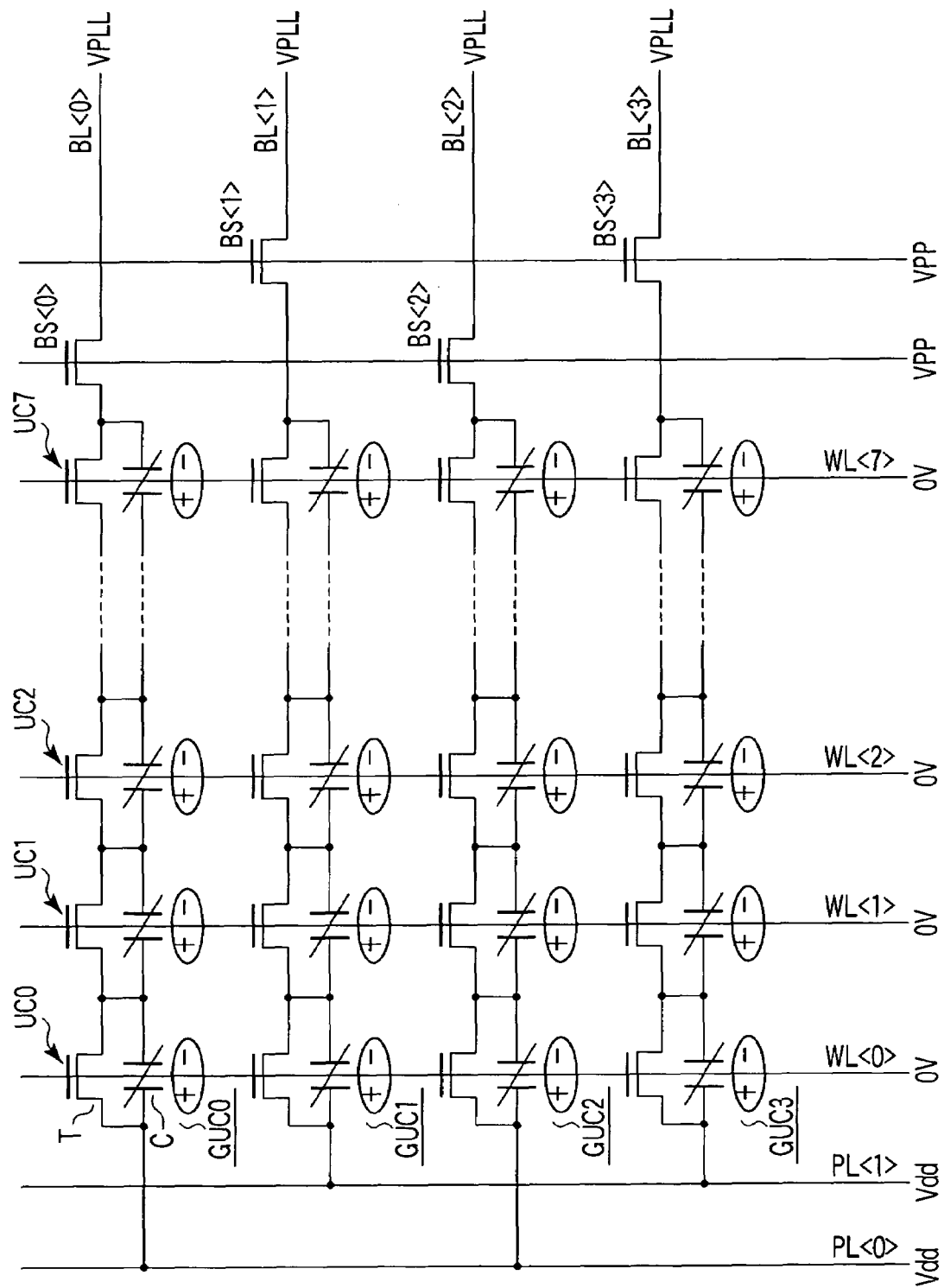
FIG. 20 is a circuit diagram for explaining a ferroelectric memory and a method of testing the same according to the 11th embodiment of the present invention, in which the arrangement of a memory cell array and the applied voltages are illustrated by taking a TC parallel unit series-connected type ferroelectric memory as an example.
Figure 21:
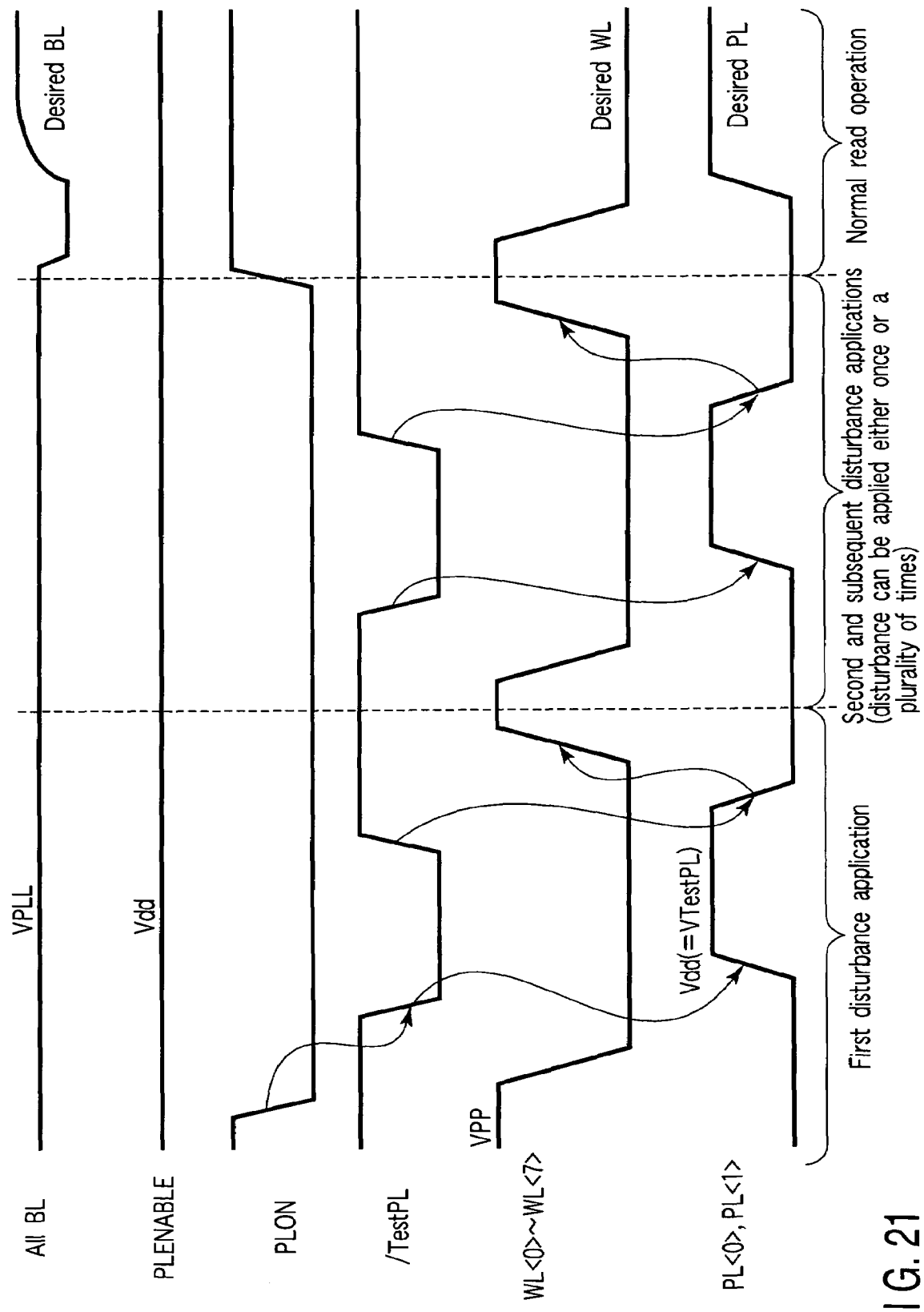
FIG. 21 is a timing chart for explaining the operation of the circuit shown in FIG. 20.

FIGS. 20 and 21 are views for explaining a ferroelectric memory and a method of testing the same according to the 11th embodiment of the present invention. FIG. 20 is a circuit diagram showing the arrangement of a memory cell array and the applied voltages by taking a TC parallel unit series-connected type ferroelectric memory as an example. FIG. 21 is a timing chart showing operating waveforms in a test mode.

In the 11th embodiment, when a disturbance voltage ΔV is to be applied to cell capacitors, eight word lines WL<0> to WL<7> are turned off (selected), and a driving potential (a standby plate line precharge potential in a normal mode) VPLL is applied to plate lines PL<0> and PL<1>, thereby applying a voltage indicated by $$\Delta V = (1/8) \times (Vdd - VPLL)$$

to each ferroelectric capacitor. Since the disturbance voltage ΔV is applied to the eight capacitors at once, the test speed can be increased.

Also, it is unnecessary to add any new generator for generating a voltage equivalent to the disturbance voltage ΔV, or to externally apply this voltage.

The procedures of the test operation will be explained below with reference to the timing chart shown in FIG. 21.

First, as shown in FIG. 20, the potential VPLL is applied to bit lines BL<0>, BL<1>, BL<2>, BL<3> . . . (All BL). In this state, a signal PLENABLE is at a power supply potential Vdd.

Subsequently, a signal PLON is changed to Low level to start not a normal mode operation but a plate line driving operation in the test mode.

Also, all the eight word lines WL<0> to WL<7> are turned off (selected) to allow application of the voltage to all the cell capacitors.

After that, in response to the change of a signal /TestPL to Low level, the plate lines PL<0> and PL<1> are pulse-driven at the potential Vdd (=VTestPL).

In a situation in which, e.g., no imprint has occurred immediately after film formation, the capacitive components of all cells are presumably equal in the "all 1" pattern as shown in FIG. 20. Therefore, a disturbance voltage indicated by $$\Delta V = (1/8) \times (Vdd - VPLL)$$

in a direction to weaken polarization is equally applied to all the cells.

Note that although FIG. 21 shows the case in which the disturbance voltage is applied twice, it may also be applied once or continuously applied three times or more where necessary.

12th Embodiment

In the 11th embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V=(\tfrac{1}{8})\times(Vdd-VPLL)$$

is reliably applied to each cell capacitor every time.

Figure 22:
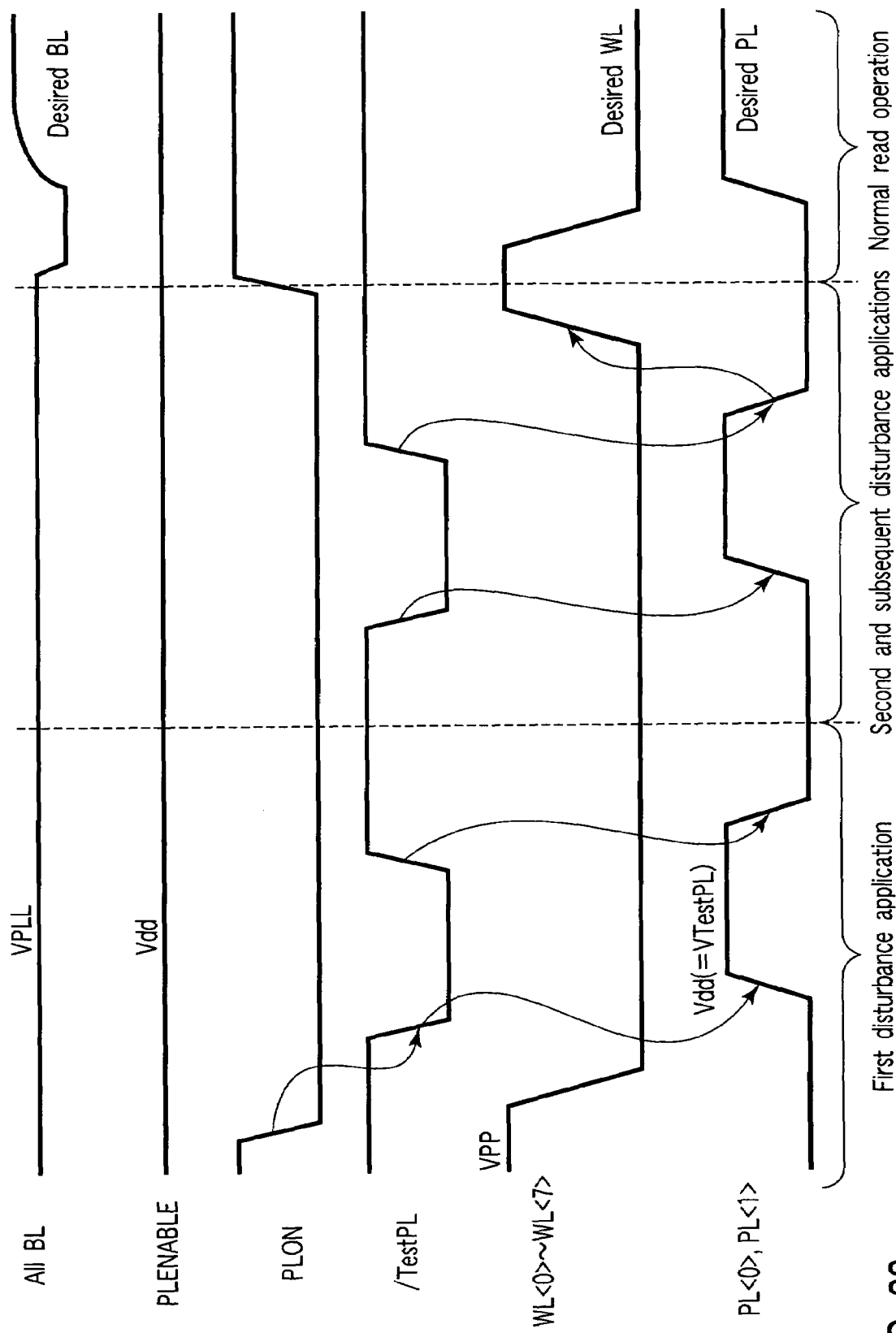
FIG. 22 is a timing chart for explaining a ferroelectric memory and the operation of a method of testing the same according to the 12th embodiment of the present invention.

From the viewpoint of a high-speed test, however, the time required to raise and drop the word line potential lowers the speed. In the 12th embodiment, therefore, as shown in FIG. 22, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage $\Delta V$ may remain between the two electrodes of each cell capacitor. This is so because polarization reversal normally hardly occurs unless a coercive voltage is exceeded, but a polarization region having a small coercive electric field microscopically probably exists.

Accordingly, although the 12th embodiment is suitable when a high speed is required, the 11th embodiment is preferably used if it is necessary to test accurate hysteresis characteristics.

13th Embodiment

Figure 24:
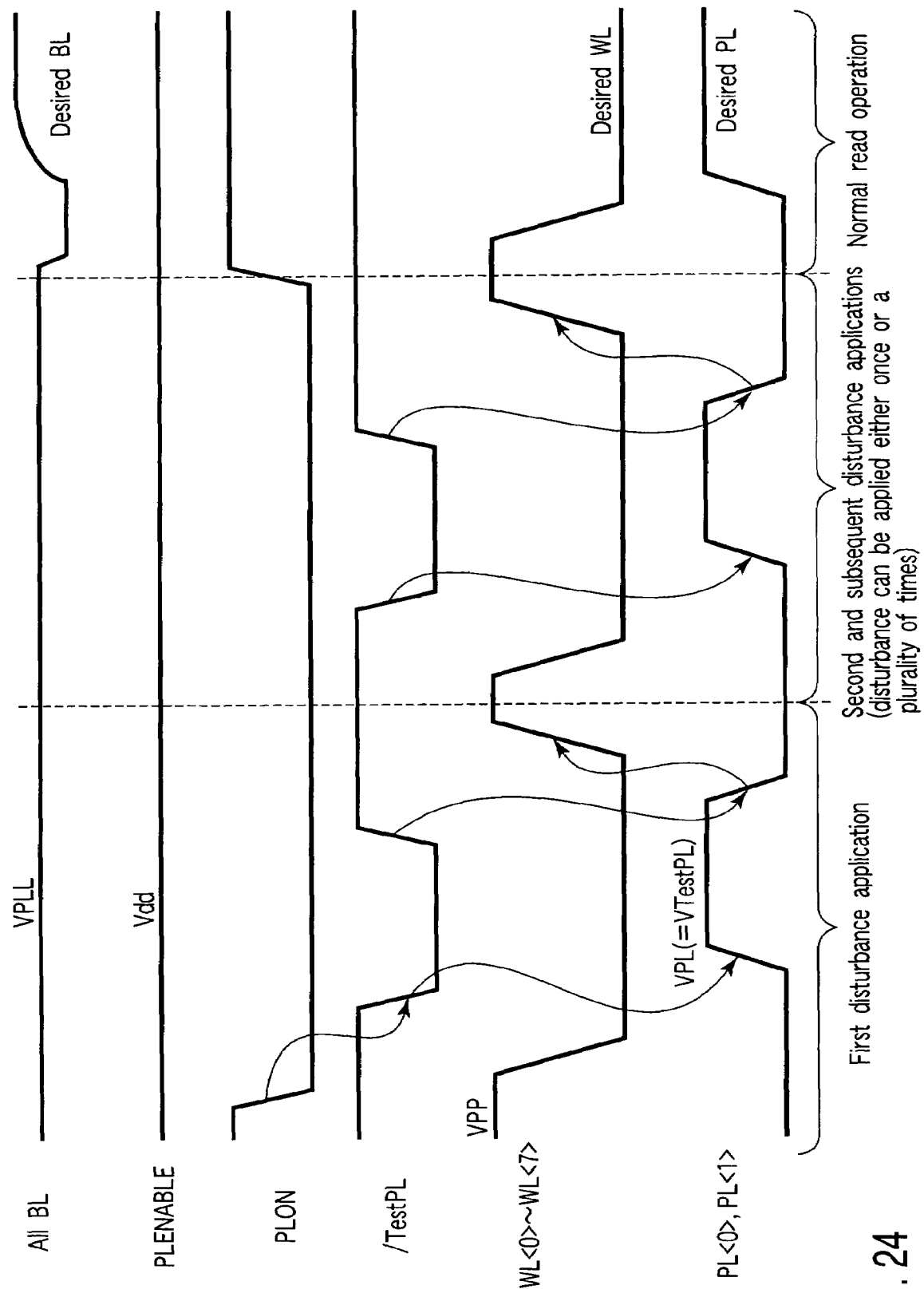
FIG. 24 is a timing chart for explaining the operation of the circuit shown in FIG. 23.

FIGS. 23 and 24 are views for explaining a ferroelectric memory and a method of testing the same according to the 13th embodiment of the present invention. FIG. 23 is a circuit diagram showing the arrangement of a memory cell array and the applied voltages by taking a TC parallel unit series-connected type ferroelectric memory as an example. FIG. 24 is a timing chart showing operating waveforms in a test mode.

In the 13th embodiment, when a disturbance voltage $\Delta V$ is to be applied to cell capacitors, eight word lines WL<0> to WL<7> are turned off (selected), and a driving potential VPLL is applied to plate lines PL<0> and PL<1>, thereby applying a voltage indicated by $$\Delta V=(\tfrac{1}{8})\times(VPL-VPLL)$$

to each ferroelectric capacitor. Since the disturbance voltage $\Delta V$ is applied to the eight capacitors at once, the test speed can be increased.

Also, it is unnecessary to add any new generator for generating a voltage equivalent to the disturbance voltage $\Delta V$, or to externally apply this voltage.

The procedures of the test operation will be explained below with reference to the timing chart shown in FIG. 24.

First, as shown in FIG. 23, the potential VPLL is applied to all bit lines BL<0>, BL<1>, BL<2>, BL<3> . . . (All BL). In this state, a signal PLENABLE is at a power supply potential Vdd.

Subsequently, a signal PLON is changed to Low level to start not a normal mode operation but a plate line driving operation in the test mode.

Also, all the eight word lines WL<0> to WL<7> are turned off (selected) to allow application of the voltage to all the cell capacitors.

After that, in response to the change of a signal /TestPL to Low level, the plate lines PL<0> and PL<1> are pulse-driven at a potential VPL (=VTestPL).

In a situation in which, e.g., no imprint has occurred immediately after film formation, the capacitive components of all cells are presumably equal in the "all 1" pattern as shown in FIG. 23. Therefore, a disturbance voltage indicated by $$\Delta V=(\tfrac{1}{8})\times(VPL-VPLL)$$

in a direction to weaken polarization is equally applied to all the cells.

Note that although FIG. 24 shows the case in which the disturbance voltage is applied twice, it may also be applied once or continuously applied three times or more where necessary.

14th Embodiment

In the 13th embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V=(\tfrac{1}{8})\times(VPL-VPLL)$$

is reliably applied to each cell capacitor every time.

Figure 25:
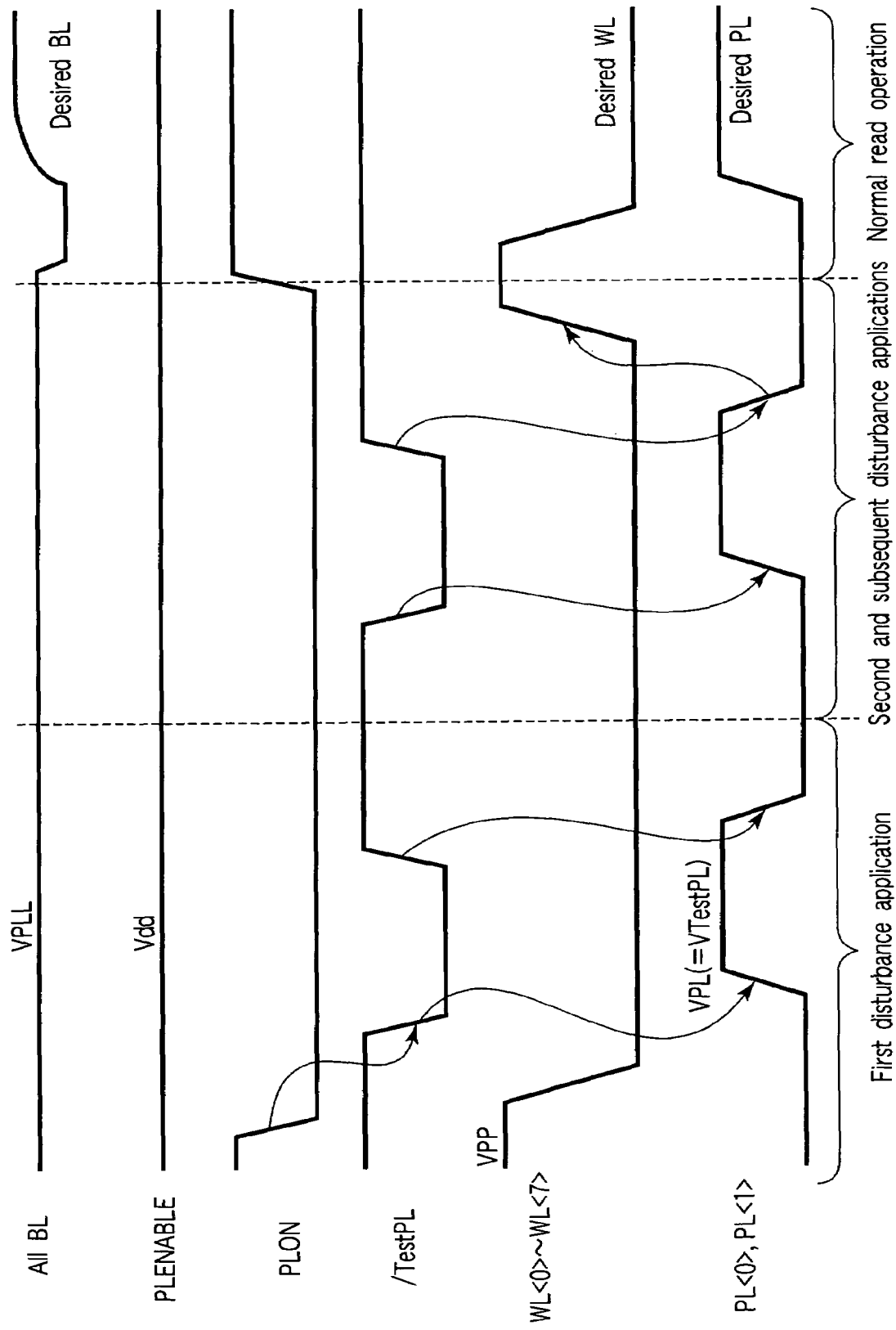
FIG. 25 is a timing chart for explaining a ferroelectric memory and the operation of a method of testing the same according to the 14th embodiment of the present invention.

From the viewpoint of a high-speed test, however, the time required to raise and drop the word line potential lowers the speed. In the 14th embodiment, therefore, as shown in FIG. 25, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage $\Delta V$ may remain between the two electrodes of each cell capacitor. This is so because polarization reversal normally hardly occurs unless a coercive voltage is exceeded, but a polarization region having a small coercive electric field microscopically probably exists.

Accordingly, although the 14th embodiment is suitable when a high speed is required, the 13th embodiment is preferably used if it is necessary to test accurate hysteresis characteristics.

15th Embodiment

Figure 26:
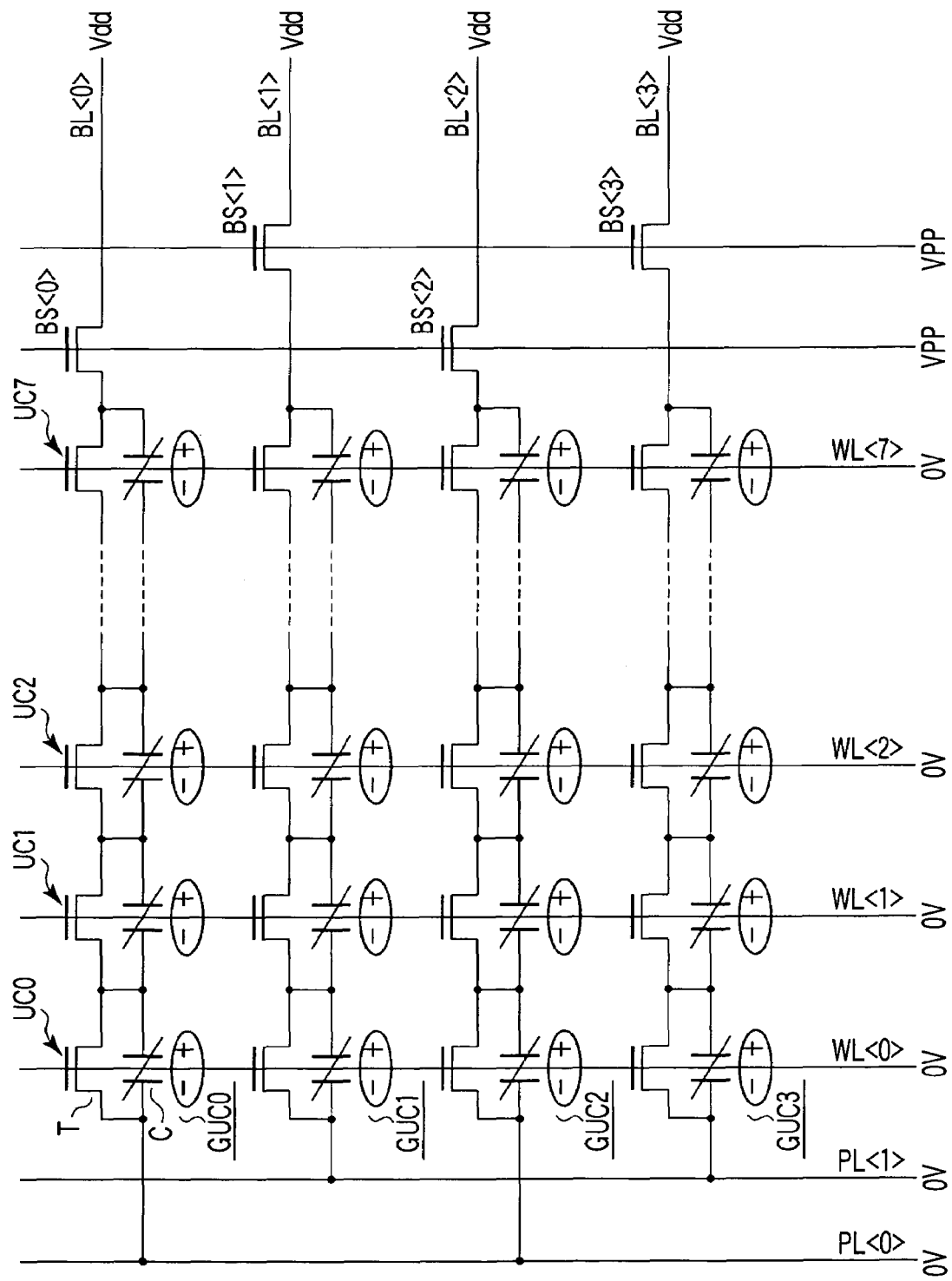
FIG. 26 is a circuit diagram for explaining a ferroelectric memory and a method of testing the same according to the 15th embodiment of the present invention, in which the arrangement of a memory cell array and the applied voltages are illustrated by taking a TC parallel unit series-connected type ferroelectric memory as an example.

FIGS. 26 and 27 are views for explaining a ferroelectric memory and a method of testing the same according to the 15th embodiment of the present invention. FIG. 26 is a circuit diagram showing the arrangement of a memory cell array and the applied voltages by taking a TC parallel unit series-connected type ferroelectric memory as an example. FIG. 27 is a timing chart showing operating waveforms in a test mode.

In the first to 14th embodiments, a disturbance voltage is so applied as to weaken the polarization of a cell capacitor in which data "1" is written. The 15th embodiment differs from these embodiments in that a disturbance voltage is so applied as to weaken the polarization of a cell capacitor in which data "0" is written.

In the 15th embodiment, when a disturbance voltage $\Delta V$ is to be applied to cell capacitors, eight word lines WL<0> to WL<7> are turned off (selected), and a power supply potential Vdd is applied between bit lines BL<0>, BL<1>, . . . and plate lines PL<0> and PL<1>, thereby applying a voltage indicated by $$\Delta V=(\tfrac{1}{8})\times Vdd$$

to each ferroelectric capacitor. Since the disturbance voltage $\Delta V$ is applied to the eight capacitors at once, the test speed can be increased.

Also, it is unnecessary to add any new generator for generating a voltage equivalent to the disturbance voltage $\Delta V$, or to externally apply this voltage.

The procedures of the test operation will be explained below with reference to the timing chart shown in FIG. 27.

First, all the plate lines PL<0>, PL<1>, . . . (All PL) are set at 0V to prepare for application of the voltage ΔV to the two terminals of series-connected ferroelectric capacitors. In this state, a signal PLENABLE is at 0V, so the plate line potential maintains 0V regardless of the potential of a signal PLON.

Subsequently, all the eight word lines WL<0> to WL<7> are turned off (selected) to turn off all the cell transistors and allow application of the voltage to all the cell capacitors.

After that, a signal /TestBL is changed in the order of High level→Low level→High level in the form of a pulse. In response to the change of the signal /TestBL, all the bit lines BL<0>, BL<1>, BL<2>, BL<3>, . . . (All BL) are pulse-driven at a Vdd level.

In a situation in which, e.g., no imprint has occurred immediately after film formation, the capacitive components of all cells are presumably equal in the "all 0" pattern as shown in FIG. 26. Therefore, a disturbance voltage indicated by $$\Delta V = (1/8) \times Vdd$$

in a direction to weaken polarization is equally applied to all the cells.

Note that although FIG. 27 shows the case in which the disturbance voltage is applied twice, it may also be applied once or continuously applied three times or more where necessary.

16th Embodiment

In the 15th embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V = (1/8) \times Vdd$$

is reliably applied to each cell capacitor every time.

From the viewpoint of a high-speed test, however, the time required to raise and drop the word line potential lowers the speed. In the 16th embodiment, therefore, as shown in FIG. 28, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage ΔV may remain between the two electrodes of each cell capacitor. This is so because polarization reversal normally hardly occurs unless a coercive voltage is exceeded, but a polarization region having a small coercive electric field microscopically probably exists.

Accordingly, although the 16th embodiment is suitable when a high speed is required, the 15th embodiment is preferably used if it is necessary to test accurate hysteresis characteristics.

17th Embodiment

Figure 29:
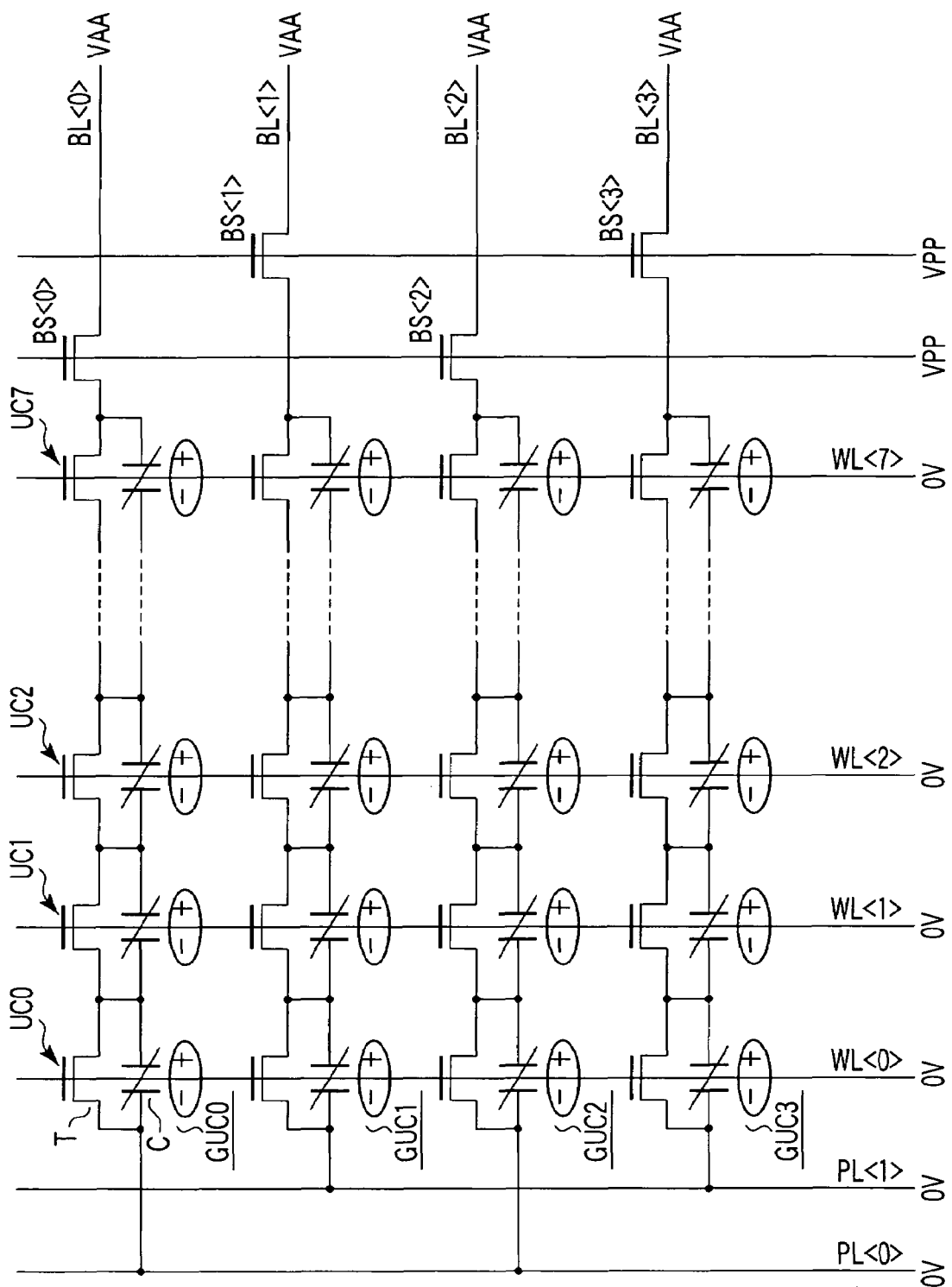
FIG. 29 is a circuit diagram for explaining a ferroelectric memory and a method of testing the same according to the 17th embodiment of the present invention, in which the arrangement of a memory cell array and the applied voltages are illustrated by taking a TC parallel unit series-connected type ferroelectric memory as an example.
Figure 30:
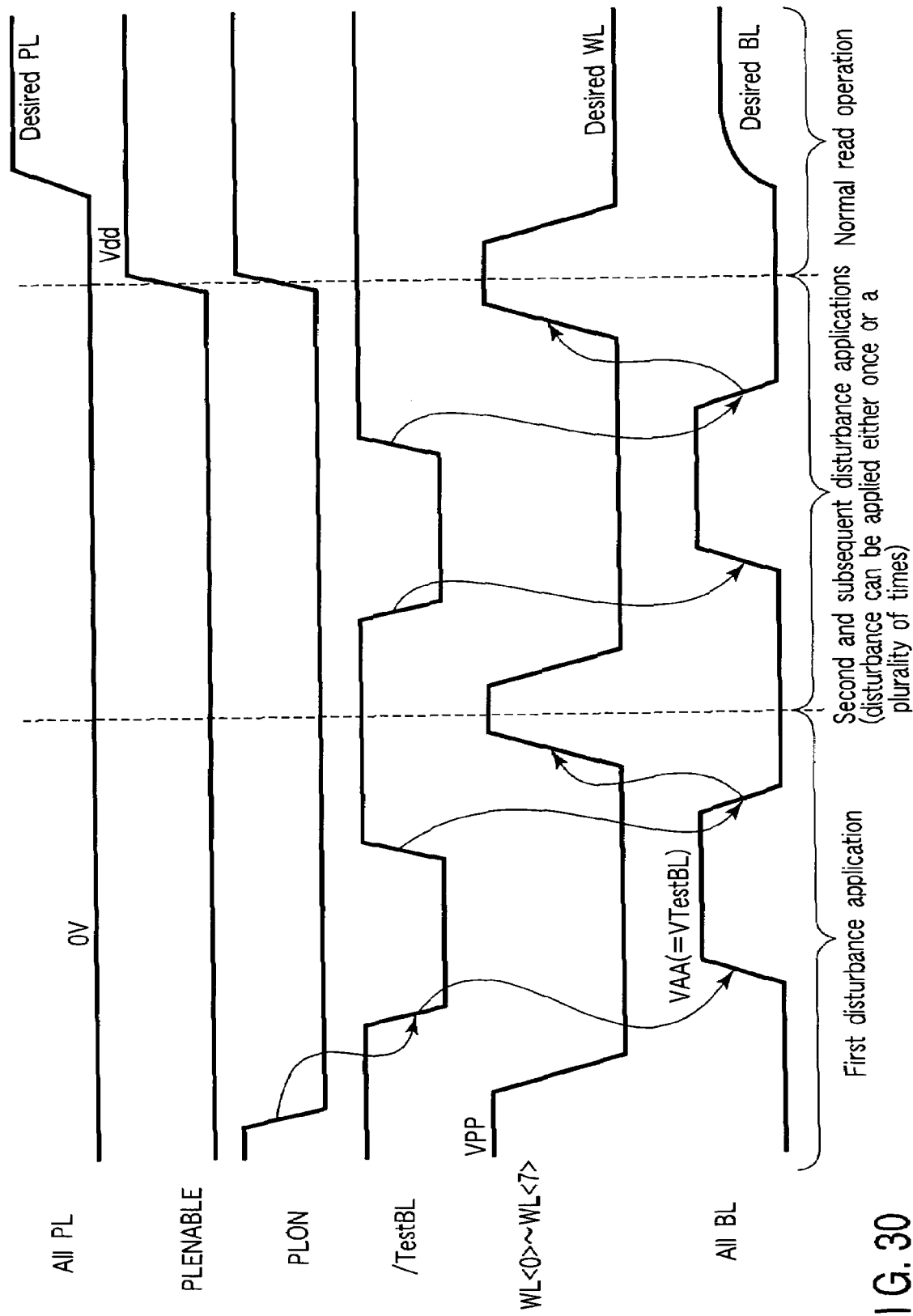
FIG. 30 is a timing chart for explaining the operation of the circuit shown in FIG. 29.

FIGS. 29 and 30 are views for explaining a ferroelectric memory and a method of testing the same according to the 17th embodiment of the present invention. FIG. 29 is a circuit diagram showing the arrangement of a memory cell array and the applied voltages by taking a TC parallel unit series-connected type ferroelectric memory as an example. FIG. 30 is a timing chart showing operating waveforms in a test mode.

In the 17th embodiment, when a disturbance voltage ΔV is to be applied to cell capacitors, eight word lines WL<0> to WL<7> are turned off (selected), and a power supply potential VAA for a sense amplifier 23 is applied between bit lines BL<0>, BL<1>, . . . and plate lines PL<0> and PL<1>, thereby applying a voltage indicated by $$\Delta V = (1/8) \times VAA$$

to each ferroelectric capacitor. Since the disturbance voltage ΔV is applied to the eight capacitors at once, the test speed can be increased.

Also, it is unnecessary to add any new generator for generating a voltage equivalent to the disturbance voltage ΔV, or to externally apply this voltage.

The procedures of the test operation will be explained below with reference to the timing chart shown in FIG. 30.

First, all the plate lines PL<0>, PL<1>, . . . (All PL) are set at 0V to prepare for application of the voltage ΔV to the two terminals of series-connected ferroelectric capacitors. In this state, a signal PLENABLE is at 0V, so the plate potential is 0V regardless of the potential of a signal PLON.

Subsequently, all the eight word lines WL<0> to WL<7> are turned off (selected) to allow application of the voltage to all the cell capacitors.

After that, a signal /TestBL is changed in the order of High level→Low level→High level in the form of a pulse, thereby pulse-driving All BL (all the bit lines BL<0>, BL<1>, BL<2>, BL<3>, . . . ) at the potential VAA.

In a situation in which, e.g., no imprint has occurred immediately after film formation, the capacitive components of all cells are presumably equal in the "all 0" pattern as shown in FIG. 29. Therefore, a disturbance voltage indicated by $$\Delta V = (1/8) \times VAA$$

in a direction to weaken polarization is equally applied to all the cells.

Note that although FIG. 30 shows the case in which the disturbance voltage is applied twice, it may also be applied once or continuously applied three times or more where necessary.

18th Embodiment

In the 17th embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V = (1/8) \times VAA$$

is reliably applied to each cell capacitor every time.

Figure 31:
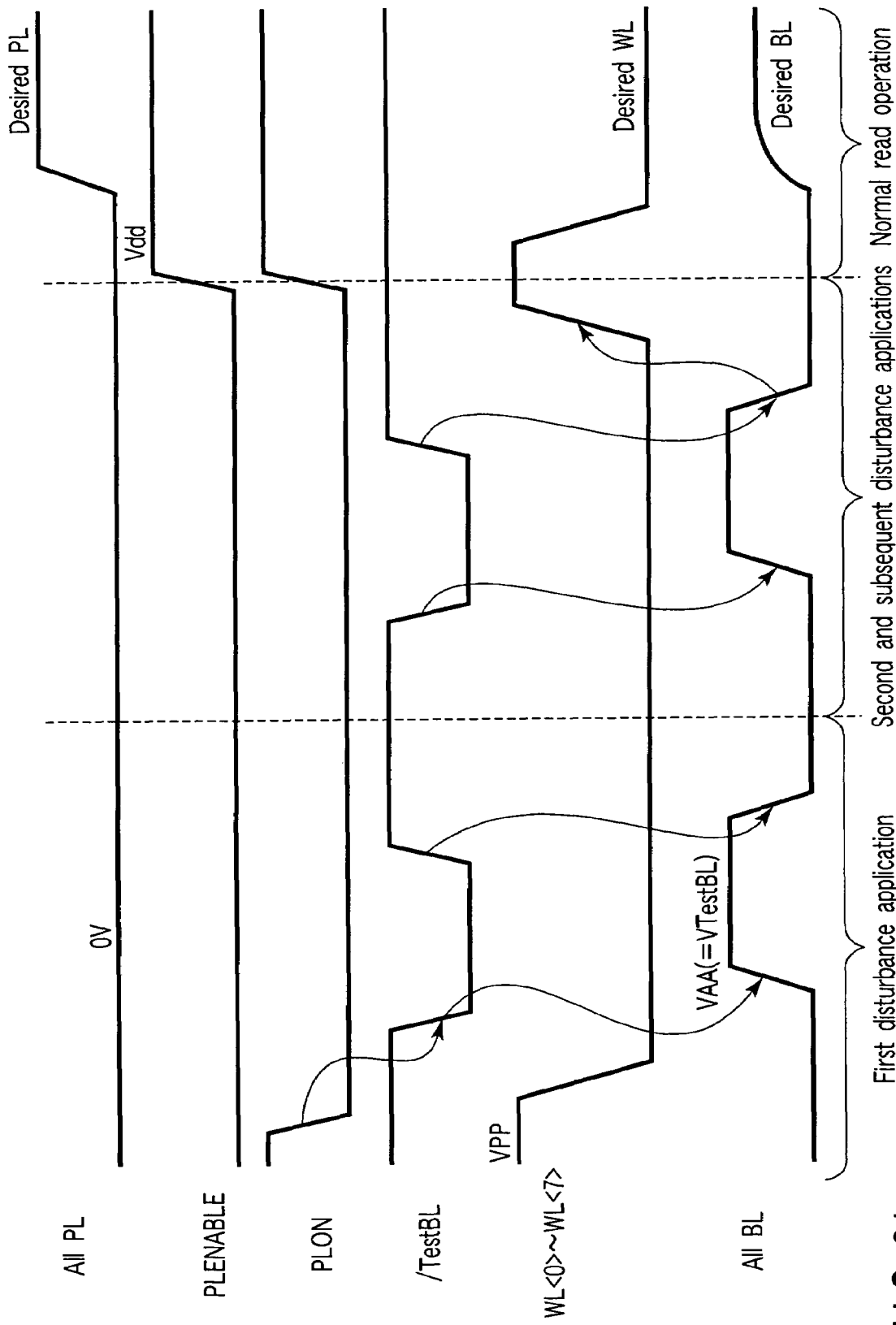
FIG. 31 is a timing chart for explaining a ferroelectric memory and the operation of a method of testing the same according to the 18th embodiment of the present invention.

From the viewpoint of a high-speed test, however, the time required to raise and drop the word line potential lowers the speed. In the 18th embodiment, therefore, as shown in FIG. 31, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage ΔV may remain between the two electrodes of each cell capacitor. This is so because polarization reversal normally hardly occurs unless a coercive voltage is exceeded, but a polarization region having a small coercive electric field microscopically probably exists.

Accordingly, although the 18th embodiment is suitable when a high speed is required, the 17th embodiment is preferably used if it is necessary to test accurate hysteresis characteristics.

19th Embodiment

Figure 32:
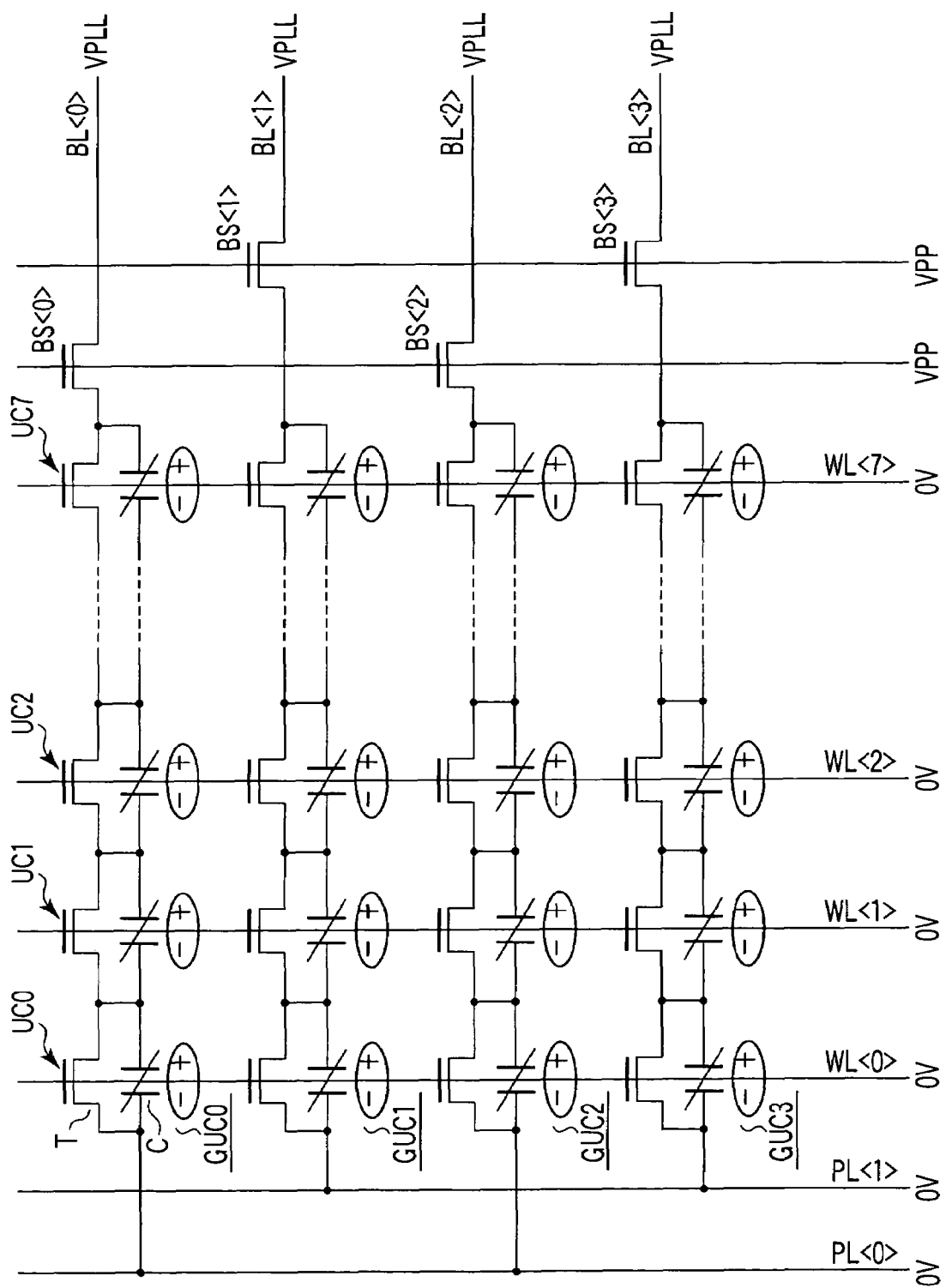
FIG. 32 is a circuit diagram for explaining a ferroelectric memory and a method of testing the same according to the 19th embodiment of the present invention, in which the arrangement of a memory cell array and the applied voltages are illustrated by taking a TC parallel unit series-connected type ferroelectric memory as an example.

FIGS. 32 and 33 are views for explaining a ferroelectric memory and a method of testing the same according to the 19th embodiment of the present invention. FIG. 32 is a circuit diagram showing the arrangement of a memory cell array and the applied voltages by taking a TC parallel unit series-connected type ferroelectric memory as an example. FIG. 33 is a timing chart showing operating waveforms in a test mode.

In the 19th embodiment, when a disturbance voltage $\Delta V$ is to be applied to cell capacitors, eight word lines WL<0> to WL<7> are turned off (selected), and a driving potential VPLL is applied between bit lines BL<0>, BL<1>, . . . and plate lines PL<0> and PL<1>, thereby applying a voltage indicated by $$\Delta V = (1/8) \times VPLL$$

to each ferroelectric capacitor. Since the disturbance voltage $\Delta V$ is applied to the eight capacitors at once, the test speed can be increased.

Also, it is unnecessary to add any new generator for generating a voltage equivalent to the disturbance voltage $\Delta V$, or to externally apply this voltage.

The procedures of the test operation will be explained below with reference to the timing chart shown in FIG. 33.

First, all the plate lines PL<0>, PL<1>, . . . (All PL) are set at 0V to prepare for application of the voltage $\Delta V$ to the two terminals of series-connected ferroelectric capacitors. In this state, a signal PLENABLE is at 0V, so the plate potential is 0V regardless of the potential of a signal PLON.

Subsequently, all the eight word lines WL<0> to WL<7> are turned off (selected) to allow application of the voltage to all the cell capacitors.

After that, a signal /TestBL is changed in the order of High level→Low level→High level in the form of a pulse. In response to this change of the signal /TestBL, all the bit lines BL<0>, BL<1>, BL<2>, BL<3>, . . . (All BL) are pulse-driven at a potential VAA.

In a situation in which, e.g., no imprint has occurred immediately after film formation, the capacitive components of all cells are presumably equal in the "all 0" pattern as shown in FIG. 32. Therefore, a disturbance voltage indicated by $$\Delta V = (1/8) \times VPLL$$

in a direction to weaken polarization is equally applied to all the cells.

Note that although FIG. 33 shows the case in which the disturbance voltage is applied twice, it may also be applied once or continuously applied three times or more where necessary.

20th Embodiment

In the 19th embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V = (1/8) \times VPLL$$

is reliably applied to each cell capacitor every time.

Figure 34:
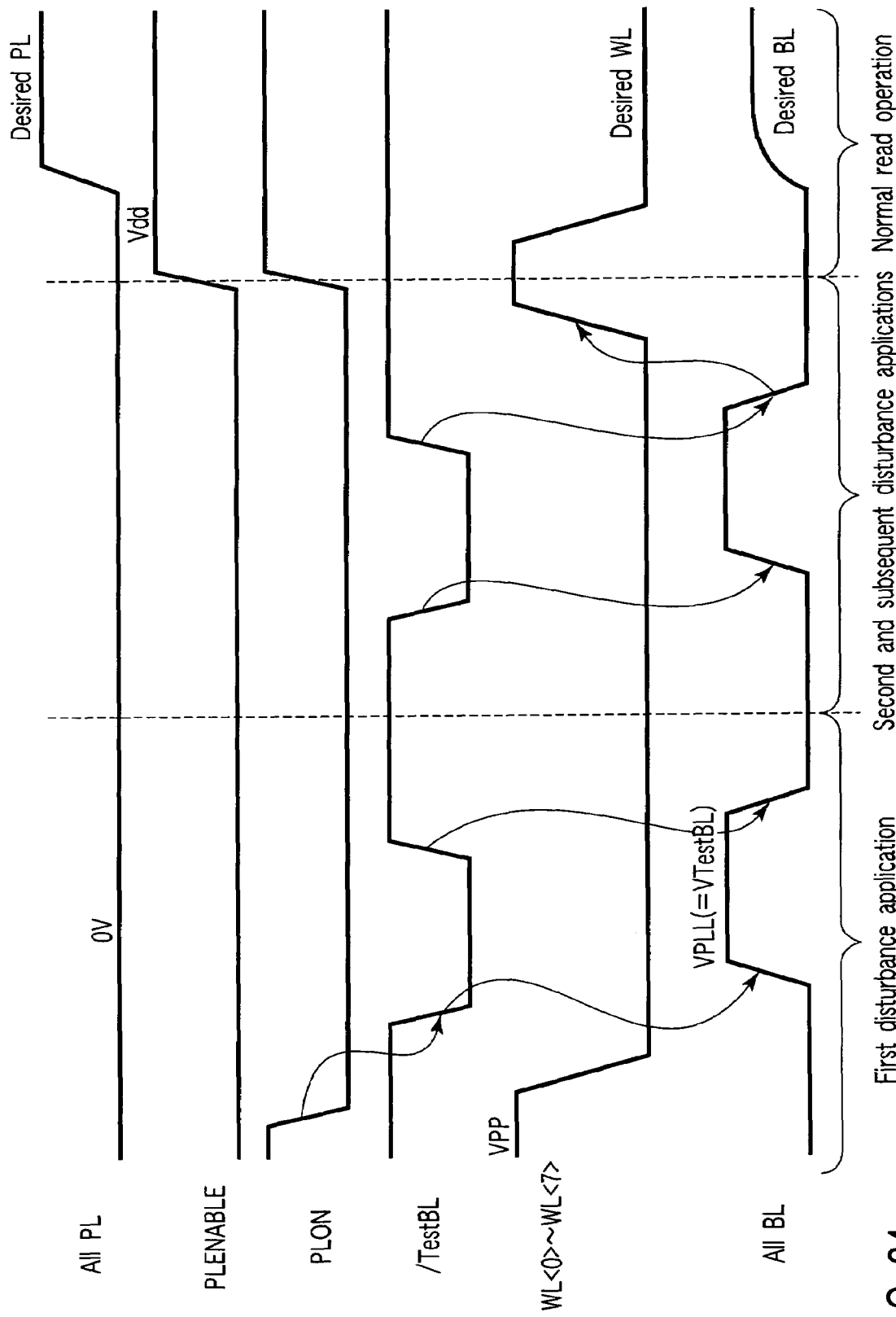
FIG. 34 is a timing chart for explaining a ferroelectric memory and the operation of a method of testing the same according to the 20th embodiment of the present invention.

From the viewpoint of a high-speed test, however, the time required to raise and drop the word line potential lowers the speed. In the 20th embodiment, therefore, as shown in FIG. 34, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage $\Delta V$ may remain between the two electrodes of each cell capacitor. This is so because polarization reversal normally hardly occurs unless a coercive voltage is exceeded, but a polarization region having a small coercive electric field microscopically probably exists.

Accordingly, although the 20th embodiment is suitable when a high speed is required, the 19th embodiment is preferably used if it is necessary to test accurate hysteresis characteristics.

21st Embodiment

Figure 36:
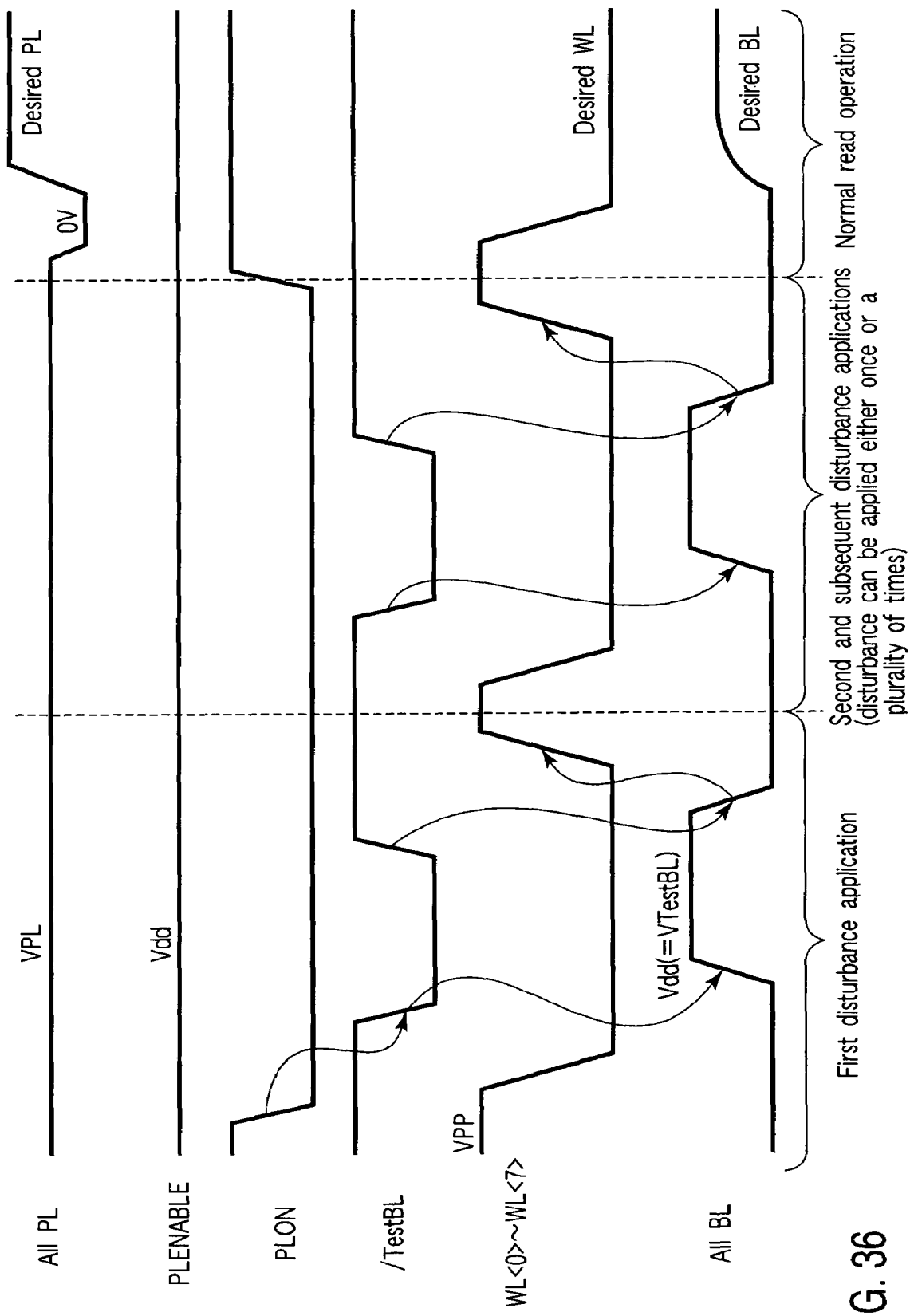
FIG. 36 is a timing chart for explaining the operation of the circuit shown in FIG. 35.

FIGS. 35 and 36 are views for explaining a ferroelectric memory and a method of testing the same according to the 21st embodiment of the present invention. FIG. 35 is a circuit diagram showing the arrangement of a memory cell array and the applied voltages by taking a TC parallel unit series-connected type ferroelectric memory as an example. FIG. 36 is a timing chart showing operating waveforms in a test mode.

In the 21st embodiment, when a disturbance voltage $\Delta V$ is to be applied to cell capacitors, eight word lines WL<0> to WL<7> are turned off (selected), and "Vdd−VPL" is applied between bit lines BL<0>, BL<1>, . . . and plate lines PL<0> and PL<1>, thereby applying a voltage indicated by $$\Delta V = (1/8) \times (Vdd - VPL)$$

to each ferroelectric capacitor. Since the disturbance voltage $\Delta V$ is applied to the eight capacitors at once, the test speed can be increased.

Also, it is unnecessary to add any new generator for generating a voltage equivalent to the disturbance voltage $\Delta V$, or to externally apply this voltage.

The procedures of the test operation will be explained below with reference to the timing chart shown in FIG. 36.

First, all the plate lines PL<0>, PL<1>, . . . (All PL) are set at 0V to prepare for application of the voltage $\Delta V$ to the two terminals of series-connected ferroelectric capacitors. In this state, a signal PLENABLE is Vdd, so not a normal operation but an operation in the test mode is started by dropping the potential of a signal PLON to 0V.

Subsequently, all the eight word lines WL<0> to WL<7> are turned off (selected) to allow application of the voltage to all the cell capacitors.

After that, a signal /TestBL is changed in the order of High level→Low level→High level in the form of a pulse. In response to this change of the signal /TestBL, all the bit lines BL<0>, BL<1>, BL<2>, BL<3>, . . . (All BL) are pulse-driven at a Vdd level.

In a situation in which, e.g., no imprint has occurred immediately after film formation, the capacitive components of all cells are presumably equal in the "all 0" pattern as shown in FIG. 35. Therefore, a disturbance voltage indicated by $$\Delta V = (1/8) \times (Vdd - VPL)$$

in a direction to weaken polarization is equally applied to all the cells.

Note that although FIG. 36 shows the case in which the disturbance voltage is applied twice, it may also be applied once or continuously applied three times or more where necessary.

22nd Embodiment

In the 21st embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V = (1/8) \times (Vdd - VPL)$$

is reliably applied to each cell capacitor every time.

From the viewpoint of a high-speed test, however, the time required to raise and drop the word line potential lowers the speed. In the 22nd embodiment, therefore, as shown in FIG. 37, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage $\Delta V$ may remain between the two electrodes of each cell capacitor. This is so because polarization reversal normally hardly occurs unless a coercive voltage is exceeded, but a polarization region having a small coercive electric field microscopically probably exists.

Accordingly, although the 22nd embodiment is suitable when a high speed is required, the 21st embodiment is preferably used if it is necessary to test accurate hysteresis characteristics.

23rd Embodiment

Figure 38:
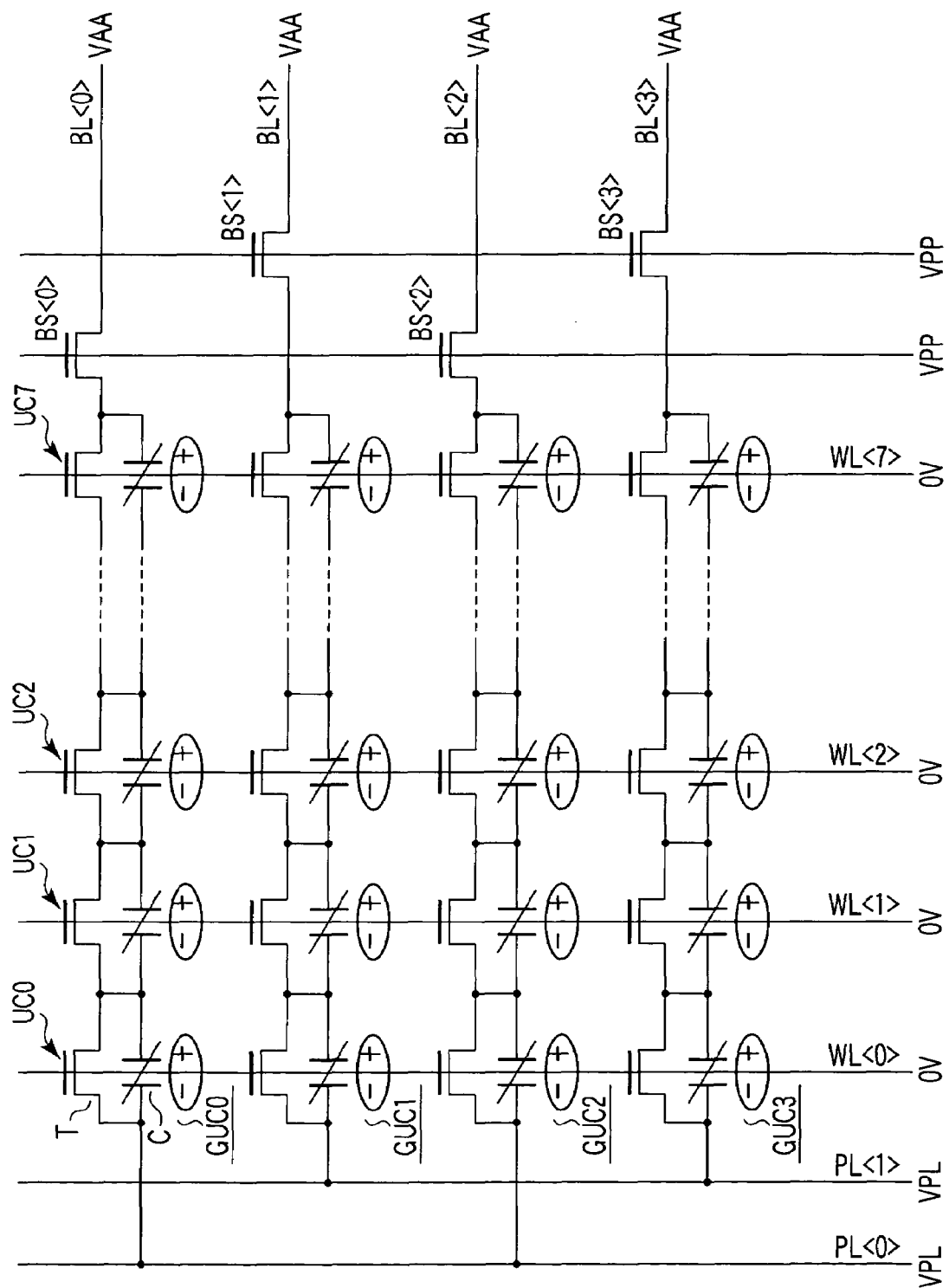
FIG. 38 is a circuit diagram for explaining a ferroelectric memory and a method of testing the same according to the 23rd embodiment of the present invention, in which the arrangement of a memory cell array and the applied voltages are illustrated by taking a TC parallel unit series-connected type ferroelectric memory as an example.
Figure 39:
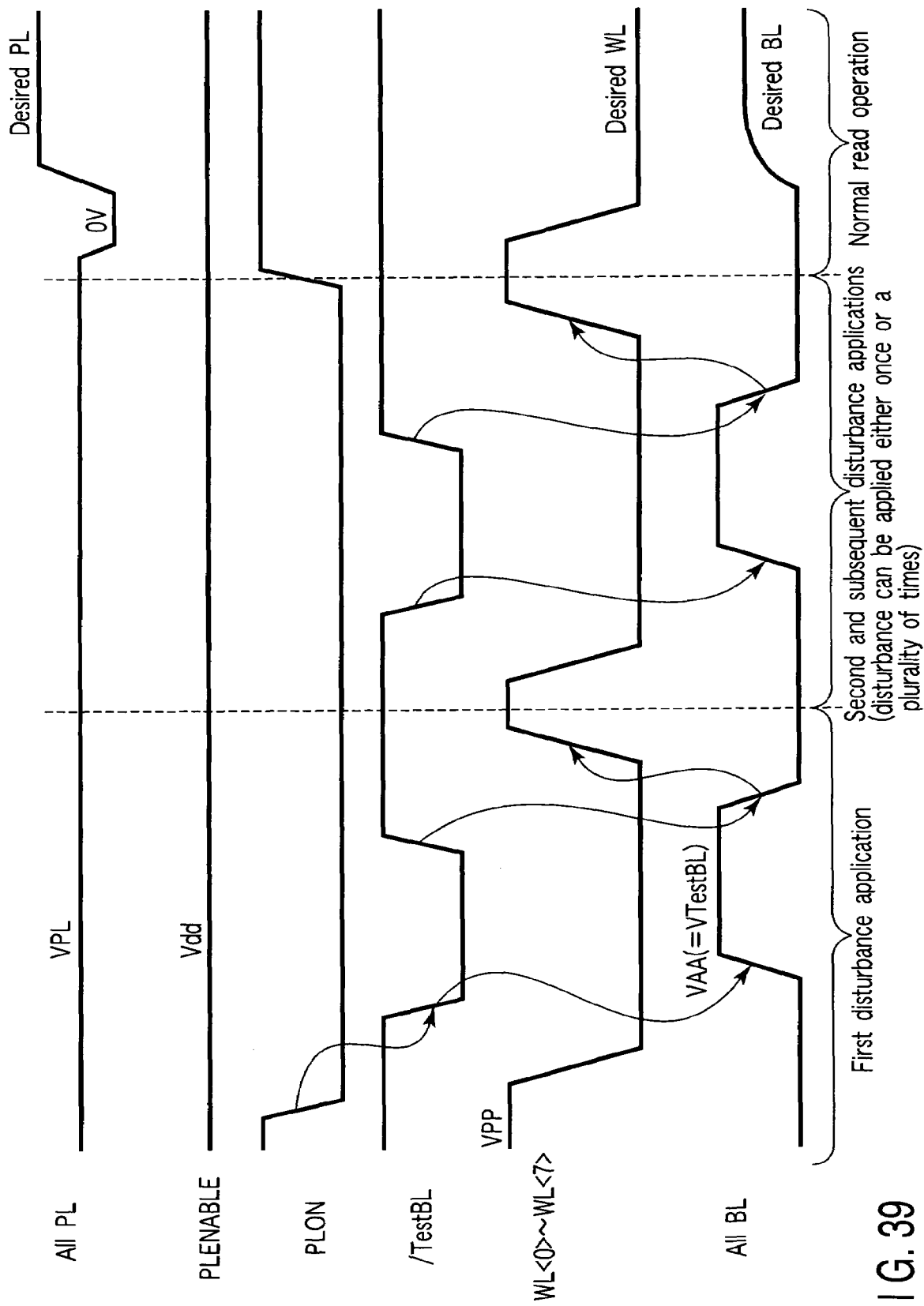
FIG. 39 is a timing chart for explaining the operation of the circuit shown in FIG. 38.

FIGS. 38 and 39 are views for explaining a ferroelectric memory and a method of testing the same according to the 23rd embodiment of the present invention. FIG. 38 is a circuit diagram showing the arrangement of a memory cell array and the applied voltages by taking a TC parallel unit series-connected type ferroelectric memory as an example. FIG. 39 is a timing chart showing operating waveforms in a test mode.

In the 23rd embodiment, when a disturbance voltage $\Delta V$ is to be applied to cell capacitors, eight word lines WL<0> to WL<7> are turned off (selected), and "VAA−VPL" is applied between bit lines BL<0>, BL<1>, . . . and plate lines PL<0> and PL<1>, thereby applying a voltage indicated by $$\Delta V = (1/8) \times (VAA - VPL)$$

to each ferroelectric capacitor. Since the disturbance voltage $\Delta V$ is applied to the eight capacitors at once, the test speed can be increased.

Also, it is unnecessary to add any new generator for generating a voltage equivalent to the disturbance voltage $\Delta V$, or to externally apply this voltage.

The procedures of the test operation will be explained below with reference to the timing chart shown in FIG. 39.

First, all the plate lines PL<0>, PL<1>, . . . (All PL) are set at a potential VAA to prepare for application of the voltage $\Delta V$ to the two electrodes of each ferroelectric capacitor. In this state, a signal PLENABLE is at the potential VAA, so not a normal operation but an operation in the test mode is started by dropping the potential of a signal PLON to 0V.

Subsequently, all the eight word lines WL<0> to WL<7> are turned off (selected) to allow application of the voltage to all the cell capacitors.

After that, a signal /TestBL is changed in the order of High level→Low level→High level in the form of a pulse. In response to this change of the signal /TestBL, all the bit lines BL<0>, BL<1>, BL<2>, BL<3>, . . . (All BL) are pulse-driven at the potential VAA.

In a situation in which, e.g., no imprint has occurred immediately after film formation, the capacitive components of all cells are presumably equal in the "all 0" pattern as shown in FIG. 38. Therefore, a disturbance voltage indicated by $$\Delta V = (1/8) \times (VAA - VPL)$$

in a direction to weaken polarization is equally applied to all the cells.

Note that although FIG. 39 shows the case in which the disturbance voltage is applied twice, it may also be applied once or continuously applied three times or more where necessary.

24th Embodiment

In the 23rd embodiment described above, after the plate lines are pulse-driven, the word line potential is once raised to shortcircuit the two electrodes of each ferroelectric capacitor, thereby resetting the potential difference to 0V. After that, pulse driving is performed again.

In this method, the voltage indicated by $$\Delta V = (1/8) \times (VAA - VPL)$$

is reliably applied to each cell capacitor every time.

Figure 40:
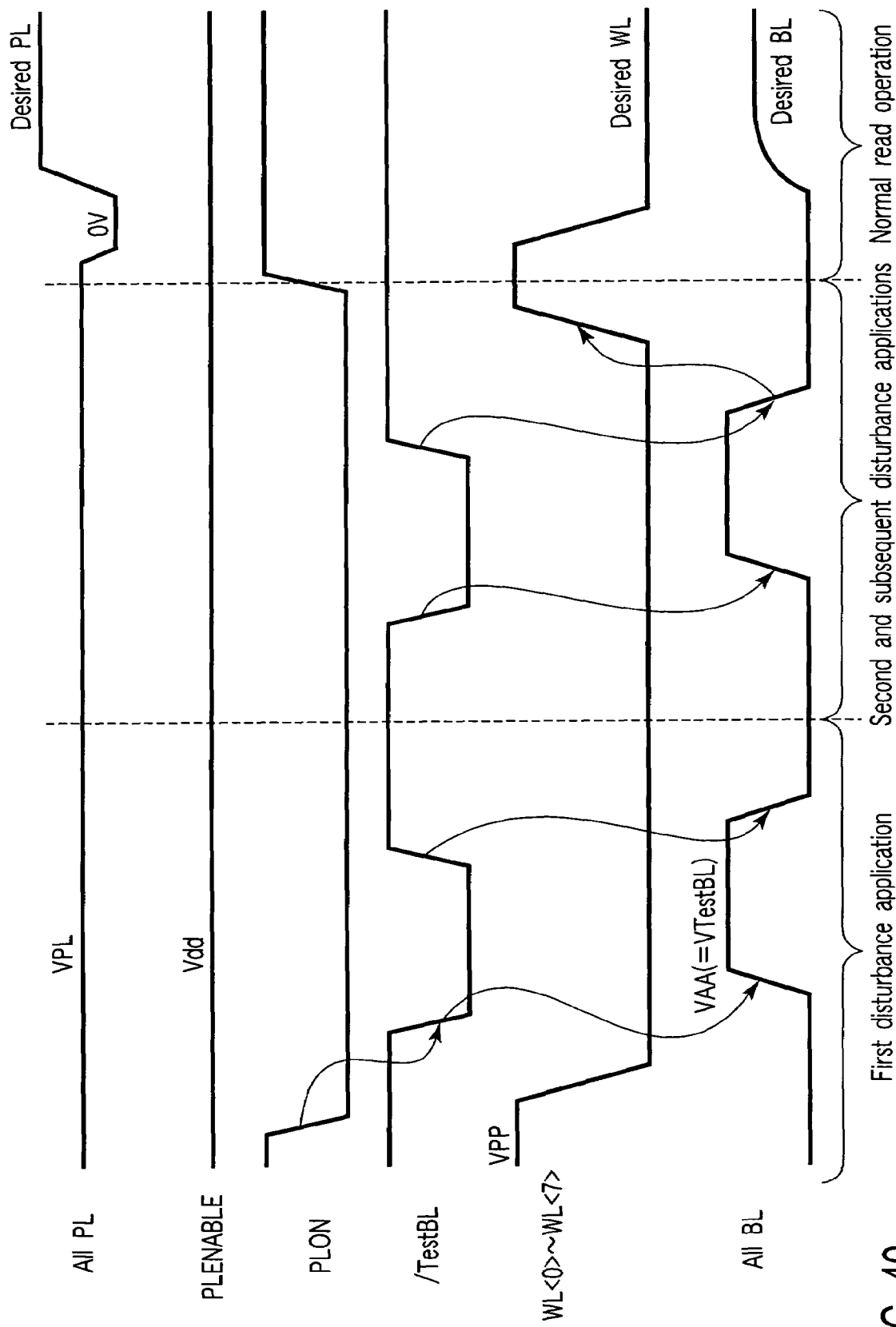
FIG. 40 is a timing chart for explaining a ferroelectric memory and the operation of a method of testing the same according to the 24th embodiment of the present invention.

From the viewpoint of a high-speed test, however, the time required to raise and drop the word line potential lowers the speed. In the 24th embodiment, therefore, as shown in FIG. 40, a high-speed test is given priority by repeating pulse driving without resetting the potential difference to 0V as described above.

At the end of the first pulse driving, however, a potential difference which is produced by electric charge generated when polarization reversal occurs by the application of the disturbance voltage $\Delta V$ may remain between the two electrodes of each cell capacitor. This is so because polarization reversal normally hardly occurs unless a coercive voltage is exceeded, but a polarization region having a small coercive electric field microscopically probably exists.

Accordingly, although the 24th embodiment is suitable when a high speed is required, the 23rd embodiment is preferably used if it is necessary to test accurate hysteresis characteristics.

In the first to 24th embodiments of the present invention as described above, a ferroelectric cell can be tested within a short time after depolarization has well occurred. Also, the test speed can be increased because a plurality of cells are selectively tested at once, and the test can be simplified because no micropotential need be generated.

Note that in each embodiment described above, the same potential is applied when disturbance is to be applied a plurality of number of times. However, different potentials may also be applied. For example, while data is written in each unit cell of a block and a plurality of word lines are kept off (selected), a plate line driving potential higher than a bit line driving potential is applied, thereby applying the first disturbance to each unit cell in the block. Then, a bit line driving potential higher than the plate line driving potential is applied to give the second disturbance to each unit cell in the block. After that, the data is read out from each unit cell to evaluate it.

In the step of applying the first disturbance, any of the power supply potential, the standby plate line precharge potential in the normal mode, and the power supply potential of the sense amplifier is used as the plate line driving potential, and the ground potential is used as the bit line driving potential.

Also, in the step of applying the second disturbance, one of the power supply potential and the standby bit line precharge potential in the normal mode is used as the bit line driving potential, and the ground potential is used as the plate line driving potential.

It is of course also possible to alternately repeat the steps of applying the first disturbance and second disturbance a plurality of number of times.

According to an aspect of the present invention, data is not read out immediately after it is written in a ferroelectric cell, but read out after a microvoltage which weakens polarization corresponding to the written voltage is once applied to a plurality of cells. This makes it possible to evaluate the cell characteristics after depolarization has occurred within a short time period, and rapidly screen a defective cell having a low coercive voltage.

Accordingly, each embodiment of the present invention can provide a ferroelectric memory and a method of testing the same which can increase the test speed and simplify the test.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:
a block in which a plurality of unit cells each formed by connecting two electrodes of a ferroelectric capacitor to a source and drain of a first MOS transistor are connected in series;
word lines each connected to a gate of the first MOS transistor;
a word line driver which selectively drives the word lines on the basis of a row address signal;
a plate line connected to one terminal of the block;
a plate line driver which drives the plate line;
a bit line connected to the other terminal of the block via a second MOS transistor for block selection;
a column decoder which selects the bit line on the basis of a column address signal; and
a driver/controller configured to apply a potential difference between the plate line and the bit line while said plurality of word lines are kept off, the driver/controller generating and outputting a driving signal for the plate line by receiving a driving potential in a normal mode of the plate line driver and a testing plate line potential from the plate line driver, and generating and outputting a driving signal for the bit line by receiving a testing bit line potential from the column decoder.

2. A ferroelectric memory comprising:
a block in which a plurality of unit cells each formed by connecting two electrodes of a ferroelectric capacitor to a source and drain of a first MOS transistor are connected in series;
word lines each connected to a gate of the first MOS transistor;
a word line driver which selectively drives the word lines on the basis of a row address signal;
a plate line connected to one terminal of the block;
a plate line driver which drives the plate line;
a bit line connected to the other terminal of the block via a second MOS transistor for block selection;
a column decoder which selects the bit line on the basis of a column address signal; and
a driver/controller configured to apply a potential difference between the plate line and the bit line while said plurality of word lines are kept off, wherein the driver/controller simultaneously applies a potential difference in a direction to weaken polarization to a plurality of unit cells in a block placed between the plate line and the bit line.

3. A memory according to claim 1, wherein the driver/controller comprises a first circuit which supplies a potential to the plate line, and a second circuit which supplies a potential to the bit line.

4. A memory according to claim 3, wherein the first circuit comprises a third MOS transistor of a first-conductivity-type which has a current path one end of which is supplied with a plate line driving potential in a normal mode, a first NAND gate which is supplied with a row address signal, a plate line enable signal, and a signal for designating one of the normal mode and a test mode, a first inverter which is supplied with an output signal from the first NAND gate, a second inverter which is supplied with an output signal from the first inverter and supplies an output signal to a gate of the third MOS transistor, a fourth MOS transistor of the first-conductivity-type which has a current path one end of which is supplied with a testing plate line potential, and the other end of the current path connected to the other end of the current path of the third MOS transistor, a second NAND gate which is supplied with the row address signal and a plate line test signal, a third inverter which is supplied with an output signal from the second NAND gate, a fourth inverter which is supplied with an output signal from a third inverter and supplies an output signal to a gate of the fourth MOS transistor, a fifth MOS transistor of a second-conductivity-type which has a current path one end of which is connected to the other ends of the third MOS transistor and the fourth MOS transistor, and the other end of the current path connected to a ground point, a third NAND gate which is supplied with the plate line enable signal and the signal for designating one of the normal mode and the test mode, a fourth NAND gate which is supplied with an output signal from the third NAND gate and an inverted signal of the plate line test signal, and a fifth NAND gate which is supplied with an output signal from the fourth NAND gate and the row address signal and supplies an output signal to a gate of the fifth MOS transistor, and outputs a signal for driving the plate line from a connecting point of the current paths of the third MOS transistor, the fourth MOS transistor, and the fifth MOS transistor.

5. A memory according to claim 4, wherein the second circuit comprises a sixth MOS transistor of the second-conductivity-type which has a current path one end of which is applied to a testing bit line potential, a sixth NAND gate which is supplied with a column address signal, a bit line equalizing signal, and a bit line test signal, a fifth inverter which is supplied with an output signal from the sixth NAND gate and supplies an output signal to a gate of the sixth MOS transistor, a seventh MOS transistor of the second-conductivity-type which has a current path one end of which is connected to the other end of the current path of the sixth MOS transistor, and the other end of the current path connected to a ground point, a NOR gate which is supplied with an inverted signal of the bit line equalizing signal and an inverted signal of the bit line test signal, and a seventh NAND gate which is supplied with an output signal from the NOR gate and the column address signal and supplies an output signal to a gate of the seventh MOS transistor, and outputs a signal for driving the bit line from a connecting point of the current paths of the sixth MOS transistor and the seventh MOS transistor.

6. A memory according to claim 1, wherein the word lines and the plate line run parallel to each other, and the bit line runs in a direction to intersect the word lines and the plate line.

7. A memory according to claim 6, further comprising a sense amplifier which amplifies a potential of the bit line.

8. A memory according to claim 7, further comprising a signal line which externally applies a bit line driving potential in a normal mode to the bit line, and a transfer gate which is inserted between the signal line and the bit line, and transfers the bit line driving potential from the signal line to the bit line.

9. A memory according to claim 8, further comprising a DQ line running in a direction to intersect the bit line, and a DQ sense amplifier which amplifies a potential of the DQ line.

10. A memory according to claim 2, wherein the driver/controller comprises a first circuit which supplies a potential to the plate line, and a second circuit which supplies a potential to the bit line.

11. A memory according to claim 10, wherein the first circuit comprises a third MOS transistor of a first conductivity type which has a current path one end of which is supplied with a plate line driving potential in a normal mode, a first NAND gate which is supplied with a row address signal, a plate line enable signal, and a signal for designating one of the normal mode and a test mode, a first inverter which is supplied with an output signal from the first NAND gate, a second inverter which is supplied with an output signal from the first inverter and supplies an output signal to a gate of the third MOS transistor, a fourth MOS transistor of the first-conductivity-type which has a current path one end of which is supplied with a testing plate line potential, and the other end of the current path connected to the other end of the current path of the third MOS transistor, a second NAND gate which is supplied with the row address signal and a plate line test signal, a third inverter which is supplied with an output signal from the second NAND gate, a fourth inverter which is supplied with an output signal from a third inverter and supplies an output signal to a gate of the fourth MOS transistor, a fifth MOS transistor of a second conductivity type which has a current path one end of which is connected to the other ends of the third MOS transistor and the fourth MOS transistor, and the other end of the current path connected to a ground point, a third NAND gate which is supplied with the plate line enable signal and the signal for designating one of the normal mode and the test mode, a fourth NAND gate which is supplied with an output signal from the third NAND gate and an inverted signal of the plate line test signal, and a fifth NAND gate which is supplied with an output signal from the fourth NAND gate and the row address signal and supplies an output signal to a gate of the fifth MOS transistor, and outputs a signal for driving the plate line from a connecting point of the current paths of the third MOS transistor, the fourth MOS transistor, and the fifth MOS transistor.

12. A memory according to claim 11, wherein the second circuit comprises a sixth MOS transistor of the second-conductivity-type which has a current path one end of which is applied to a testing bit line potential, a sixth NAND gate which is supplied with a column address signal, a bit line equalizing signal, and a bit line test signal, a fifth inverter which is supplied with an output signal from the sixth NAND gate and supplies an output signal to a gate of the sixth MOS transistor, a seventh MOS transistor of the second conductivity type which has a current path one end of which is connected to the other end of the current path of the sixth MOS transistor, and the other end of the current path connected to a ground point, a NOR gate which is supplied with an inverted signal of the bit line equalizing signal and an inverted signal of the bit line test signal, and a seventh NAND gate which is supplied with an output signal from the NOR gate and the column address signal and supplies an output signal to a gate of the seventh MOS transistor, and outputs a signal for driving the bit line from a connecting point of the current paths of the sixth MOS transistor and the seventh MOS transistor.

13. A memory according to claim 2, wherein the word lines and the plate line run parallel to each other, and the bit line runs in a direction to intersect the word lines and the plate line.

14. A memory according to claim 13, further comprising a sense amplifier which amplifies a potential of the bit line.

15. A memory according to claim 14, further comprising a signal line which externally applies a bit line driving potential in a normal mode to the bit line, and a transfer gate which is inserted between the signal line and the bit line, and transfers the bit line driving potential from the signal line to the bit line.

16. A memory according to claim 15, further comprising a DQ line running in a direction to intersect the bit line, and a DQ sense amplifier which amplifies a potential of the DQ line.

* * * * *